(12) United States Patent  
Tsuchiya et al.

(10) Patent No.: US 9,142,661 B2  
(45) Date of Patent: Sep. 22, 2015

(54) SEMICONDUCTOR DEVICE AND METHOD FOR MANUFACTURING THE SAME

(71) Applicant: Kabushiki Kaisha Toshiba, Minato-ku (JP)

(72) Inventors: Yoshinori Tsuchiya, Aichi-ken (JP); Takashi Shinohe, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/025,038

(22) Filed: Sep. 12, 2013

(65) Prior Publication Data

US 2014/0084359 A1    Mar. 27, 2014

(30) Foreign Application Priority Data

Sep. 24, 2012  (JP) ................................ 2012-210036

(51) Int. Cl.
| | |
|---|---|
| H01L 29/78 | (2006.01) |
| H01L 29/161 | (2006.01) |
| H01L 29/66 | (2006.01) |
| H01L 29/417 | (2006.01) |
| H01L 29/45 | (2006.01) |
| H01L 29/10 | (2006.01) |
| H01L 29/16 | (2006.01) |

(52) U.S. Cl.
CPC ............ *H01L 29/78* (2013.01); *H01L 29/1095* (2013.01); *H01L 29/41766* (2013.01); *H01L 29/45* (2013.01); *H01L 29/66068* (2013.01); *H01L 29/66477* (2013.01); *H01L 29/7802* (2013.01); *H01L 29/7813* (2013.01); *H01L 29/1608* (2013.01)

(58) Field of Classification Search
CPC ...................... H01L 29/1608; H01L 29/66068; H01L 29/66477; H01L 29/7802; H01L 29/7812; H01L 29/7813; H01L 29/7827; H01L 29/78684; H01L 29/41766
USPC .............................. 257/77, 329; 438/268, 270
See application file for complete search history.

(56) References Cited

U.S. PATENT DOCUMENTS

2012/0205670 A1    8/2012    Kudou et al.

FOREIGN PATENT DOCUMENTS

| JP | 3-24737 A | 2/1991 |
|---|---|---|
| JP | 7-235672 A | 9/1995 |
| JP | 2009-182271 | 8/2009 |
| JP | 2010-147298 | 7/2010 |
| JP | 2010-171417 | 8/2010 |
| WO | WO 2011/048800 A1 | 4/2011 |

OTHER PUBLICATIONS

Office Action issued on Sep. 2, 2014 in the counterpart Japanese patent Application No. 2012-210036 (with English Translation).
Office Action issued Apr. 6, 2015 in Japanese Patent Application No. 2012-210036 (with English language translation).

*Primary Examiner* — Matthew W Such
*Assistant Examiner* — Scott Stowe
(74) *Attorney, Agent, or Firm* — Oblon, McClelland, Maier & Neustadt, L.L.P.

(57) ABSTRACT

According to one embodiment, a semiconductor device includes a first semiconductor region of a first conductivity type, a second semiconductor region of a second conductivity type, a third semiconductor region of a first conductivity type, a first electrode, and a contact region. The second semiconductor region is provided on the first semiconductor region. The third semiconductor region is provided on the second semiconductor region. The first electrode has a first and a second portion. The first portion is provided in a first direction and has a lower end being positioned below a lower end of the third semiconductor region. The second portion is in contact with the first portion and is provided on the third semiconductor region. The contact region is provided between the first portion and the second semiconductor region and is electrically connected to the first electrode and the second semiconductor region.

18 Claims, 16 Drawing Sheets

… … … … … … … … … … … … … … … … … … … … …

SEMICONDUCTOR DEVICE AND METHOD FOR MANUFACTURING THE SAME

CROSS-REFERENCE TO RELATED APPLICATIONS

This application is based upon and claims the benefit of priority from the Japanese Patent Application No. 2012-210036, filed on Sep. 24, 2012; the entire contents of which are incorporated herein by reference.

FIELD

Embodiments described herein relate generally to a semiconductor device and a method for manufacturing the same.

BACKGROUND

A device using silicon carbide (SiC), for example, has received attention as a low-loss semiconductor device which can be operated under high temperature. Silicon carbide (SiC) has excellent physical properties such as a band gap being three times that of silicon (Si), breakdown electric field strength being approximately ten times that of silicon, and thermal conductivity being approximately three times that of silicon. It is desired, in such semiconductor device, that an electrode to be connected to an electric circuit or the like establish an ohmic contact. A high avalanche breakdown voltage can be obtained by a low on-state resistance and excellent well potential control when the electrode establishes a satisfactory ohmic contact.

DETAILED DESCRIPTION

Figure 1:
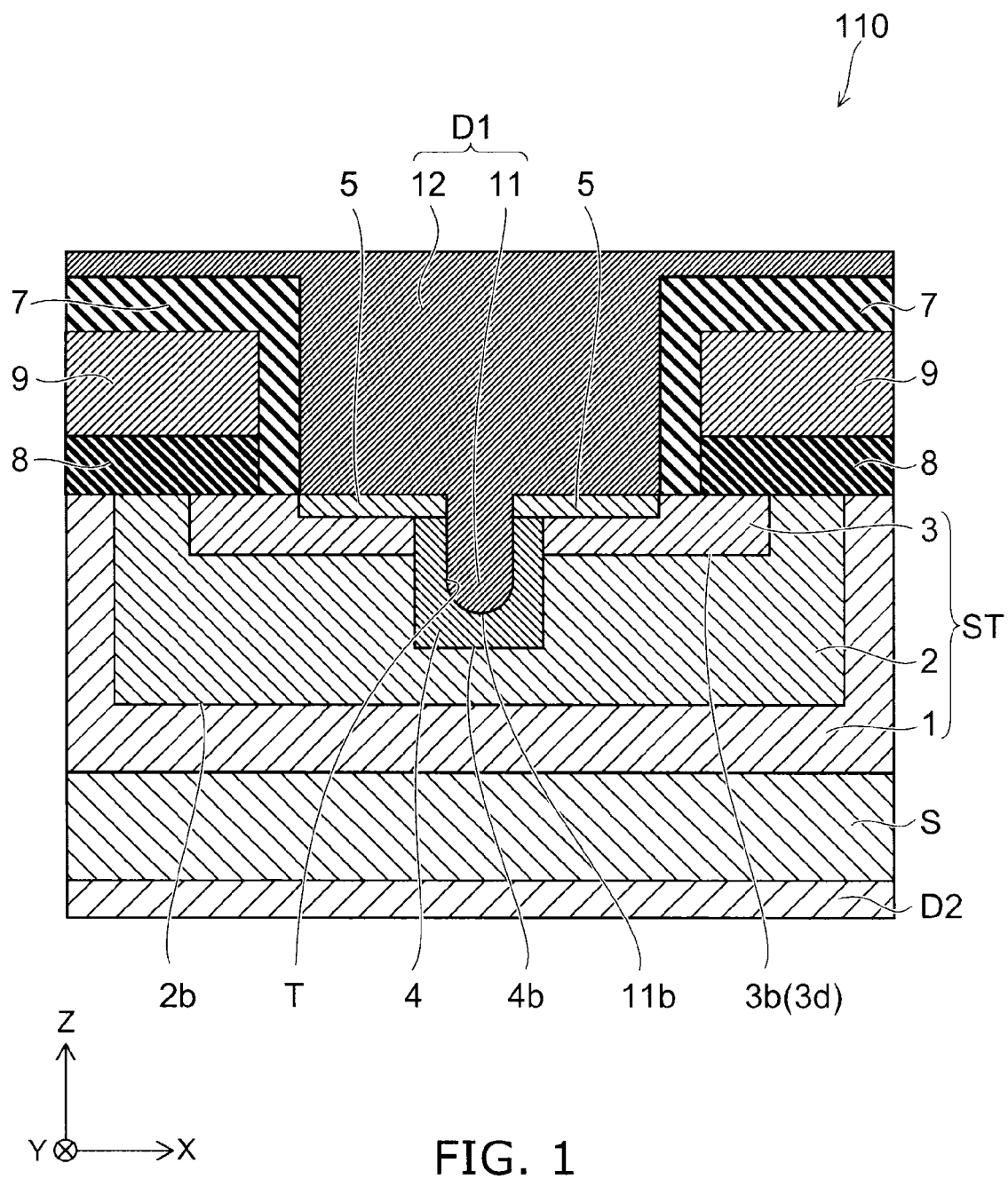
FIG. 1 is a schematic view illustrating a configuration of a semiconductor device according to a first embodiment.

In general, according to one embodiment, a semiconductor device includes a first semiconductor region of a first conductivity type, a second semiconductor region of a second conductivity type, a third semiconductor region of a first conductivity type, a first electrode, and a first contact region. The second semiconductor region is provided on the first semiconductor region. The third semiconductor region is provided on the second semiconductor region. The first electrode has a first portion and a second portion. The first portion is provided in a first direction directed from the first semiconductor region toward the second semiconductor region. The first portion has a lower end being positioned below a lower end of the third semiconductor region. The second portion is in contact with the first portion. The second portion is provided on the third semiconductor region. The first contact region is provided between the first portion and the second semiconductor region. The first contact region is electrically connected to the first electrode and the second semiconductor region.

Various embodiments will be described hereinafter with reference to the accompanying drawings. Note that in the following description, an identical reference numeral will be assigned to an identical member while description of a member described once will be omitted as appropriate the next time it appears herein.

In the following description, moreover, notations including $n^+$, n, and $n^-$ as well as $p^+$, p, and $p^-$ represent a relative level of an impurity concentration in each conductivity type. That is, an n-type impurity concentration is relatively higher in $n^+$ than in n, while the n-type impurity concentration is relatively lower in $n^-$ than in n. Moreover, a p-type impurity concentration is relatively higher in $p^+$ than in p, while the p-type impurity concentration is relatively lower in $p^-$ than in p.

In the following description, a specific example where a first conductivity type is an n-type while a second conductivity type is a p-type will be described as an example.

(First Embodiment)

FIG. 1 is a schematic view illustrating a configuration of a semiconductor device according to a first embodiment.

As shown in FIG. 1, a semiconductor device 110 according to the first embodiment includes a first semiconductor region 1, a second semiconductor region 2, a third semiconductor region 3, a first electrode D1, a first contact region 4, and a second contact region 5. The semiconductor device 110 is a DIMOSFET (Double Implantation MOSFET), for example. An example provided in the embodiment uses SiC as the first semiconductor region 1, the second semiconductor region 2, and the third semiconductor region 3.

The first semiconductor region 1 is a semiconductor region having a first conductivity type. The first semiconductor region 1 corresponds to a drift region of the DIMOSFET.

The second semiconductor region 2 is provided on the first semiconductor region 1. The second semiconductor region 2 is a semiconductor region having a second conductivity type and corresponds to a p-type well region of the DIMOSFET.

The embodiment defines a direction directed from the first semiconductor region 1 toward the second semiconductor region 2 as a Z direction (a first direction), a direction orthogonal to the Z direction as an X direction (a second direction), and a direction orthogonal to the Z direction and the X direction as a Y direction (a third direction). Moreover, an upward direction (an upper side) in the Z direction is directed from the first semiconductor region 1 toward the second semiconductor region 2, while a downward direction (a lower side) is directed oppositely to the upward direction.

The third semiconductor region 3 is provided on the second semiconductor region 2. The third semiconductor region 3 is a semiconductor region having the first conductivity type and corresponds to a source region of the DIMOSFET, for example.

A structure ST is a region including the first semiconductor region 1, the second semiconductor region 2, and the third semiconductor region 3.

The structure ST includes a portion where the first semiconductor region 1, the second semiconductor region 2, and the third semiconductor region 3 are disposed in the Z direction in this order. The first semiconductor region 1, the second semiconductor region 2, and the third semiconductor region 3 are disposed in this order in the X direction in a portion on an upper side of the structure ST. In a portion on the upper side of the structure ST, the second semiconductor region 2 is disposed between the first semiconductor region 1 and the third semiconductor region 3.

The first electrode D1 has a first portion 11 and a second portion 12. The first portion 11 extends in the Z direction, while the second portion 12 is in contact with the first portion 11 and provided on the third semiconductor region 3. The first portion 11 extends from an upper surface of the structure ST toward the lower side. The second portion 12 is provided on the upper side of the upper surface of the structure ST.

The width of the second portion 12 in the X direction is wider than the width of the first portion 11 in the X direction. The first portion 11 protrudes toward the lower side from a lower surface of the second portion 12. A lower end 11b of the first portion 11 is positioned below a lower end 3b of the third semiconductor region 3 and above a lower end 2b of the second semiconductor region 2.

The first contact region 4 is provided between the first portion 11 and the second semiconductor region 2. The first contact region 4 electrically connects the first electrode D1 and the second semiconductor region 2. In the embodiment, the first contact region 4 is formed in the structure ST from the upper surface thereof down to partway through the second semiconductor region 2.

A trench T is provided in the first contact region 4. The first contact region 4 thus has a U-shaped cross section in an X-Z plane. The first portion 11 of the first electrode D1 is embedded into the trench T. The first portion 11 is in ohmic contact with the second semiconductor region 2 through the first contact region 4.

The semiconductor device 110 further includes the second contact region 5. The second contact region 5 is provided between the second portion 12 and the third semiconductor region 3. The second contact region 5 electrically connects the first electrode D1 and the third semiconductor region 3. The second contact region 5 may be provided integrally with a part of the structure ST on the upper surface side thereof or provided separately.

The second portion 12 of the first electrode D1 is provided on the second contact region 5 and is in contact therewith. The second portion 12 is in ohmic contact with the third semiconductor region 3 through the second contact region 5.

The semiconductor device 110 further includes an insulating film 8, a control electrode 9, and a second electrode D2. The insulating film 8 is provided on the first semiconductor region 1, the second semiconductor region 2, and the third semiconductor region 3.

The insulating film 8 is provided on the first semiconductor region 1, the second semiconductor region 2, and the third semiconductor region 3. The insulating film 8 is a gate insulating film of the DIMOSFET, for example. The control electrode 9 is provided on the insulating film 8. The control electrode 9 is a gate electrode of the DIMOSFET. The second electrode D2 is provided on a lower side of a substrate S. The second electrode D2 is a drain electrode of the DIMOSFET, for example.

An operation of the semiconductor device 110 will now be described.

An inversion layer (a channel) is formed in the second semiconductor region 2 in the vicinity of an interface between the second semiconductor region 2 and the insulating film 8 when voltage higher than or equal to a threshold is applied to the control electrode 9 while a positive voltage relative to the first electrode D1 is applied to the second electrode D2. The semiconductor device 110 is accordingly switched to an ON state, whereby current flows from the second electrode D2 to the first electrode D1.

On the other hand, the channel disappears when the voltage applied to the control electrode 9 is lower than the threshold. The semiconductor device 110 is accordingly switched to an OFF state, whereby current flowing from the second electrode D2 to the first electrode D1 is interrupted. Moreover, a hole (an electron hole) generated in the second semiconductor region 2 flows from the first contact region 4 to the first electrode D1 while the semiconductor device 110 is in the OFF state. The avalanche resistance of the semiconductor device 110 is enhanced as a result.

The first contact region 4 in the semiconductor device 110 according to the embodiment is provided to establish a satisfactory ohmic contact between the first electrode D1 and the second semiconductor region 2. The second contact region 5 on the other hand is provided to establish a satisfactory ohmic contact between the first electrode D1 and the third semiconductor region 3. Accordingly, the first contact region 4 and the second contact region 5 allow the satisfactory ohmic contact to be established in the semiconductor device 110 between the first electrode D1 and the second semiconductor region 2 and between the first electrode D1 and the third semiconductor region 3.

The first contact region 4 is in contact with the second semiconductor region 2 in the X, Y, and Z directions. Therefore, the area of contact between the first electrode D1 and the second semiconductor region 2 increases as compared to when the first electrode D1 is in planar contact with the second semiconductor region 2. The hole generated in the second semiconductor region 2 while in the OFF state can thus be discharged to the first electrode D1 efficiently from the first contact region 4. The semiconductor device 110 has enhanced avalanche resistance compared to a semiconductor device which does not include the first contact region 4.

A specific example of the semiconductor device 110 will now be described.

The first semiconductor region 1 contains n-type 4H-SiC. The first semiconductor region 1 is provided on the substrate S, for example. The substrate S contains 4H—SiC having a hexagonal crystal structure, for example. The substrate S contains an n-type impurity with the impurity concentration of approximately $1\times10^{18}$ cm$^{-3}$ or more and $1\times10^{19}$ cm$^{-3}$ or less.

The first semiconductor region 1 contains n$^-$-type 4H—SiC. The first semiconductor region 1 contains an n-type impurity with the impurity concentration of approximately $1\times10^{15}$ cm$^{-3}$ or more and $1\times10^{17}$ cm$^{-3}$ or less. The n-type impurity may be used nitrogen (N) or phosphorus (P), for example. The thickness of the first semiconductor region 1 is approximately 5 micrometers (μm) or more and 15 μm or less.

The second electrode D2 is provided on a lower surface of the substrate S. The second electrode D2 is formed of nickel (Ni) silicide, for example.

The second semiconductor region 2 contains p-type 4H—SiC. The second semiconductor region 2 contains a p-type impurity with the impurity concentration of approximately $5\times10^{16}$ cm$^{-3}$ or more and $2\times10^{18}$ cm$^{-3}$ or less. The thickness of the second semiconductor region 2 is approximately 0.1 µm or more and 1.5 µm or less, favorably.

The third semiconductor region 3 contains n$^+$-type 4H—SiC. An impurity contained in the third semiconductor region 3 is at least either nitrogen (N) or phosphorus (P), for example. The impurity concentration of the third semiconductor region 3 is favorably $5\times10^{19}$ cm$^{-3}$ or more and $3\times10^{21}$ cm$^{-3}$ or less.

The first contact region 4 is in contact with the third semiconductor region 3 and the second semiconductor region 2. A lower side portion of the first contact region 4 is covered by the second semiconductor region 2 and is in contact therewith. An upper side portion of the first contact region 4 is in contact with the third semiconductor region 3. The thickness of the first contact region 4 is 0.05 µm or more and 1.0 µm or less. A lower end 4b of the first contact region 4 is positioned above the lower end of the second semiconductor region 2.

An impurity contained in the first contact region 4 is at least either boron (B) or aluminum (Al), for example. The impurity concentration in the first contact region 4 is higher than the impurity concentration in the second semiconductor region 2. That is, the impurity concentration in the first contact region 4 is favorably $1\times10^{19}$ cm$^{-3}$ or more and $3\times10^{21}$ cm$^{-3}$ or less.

The second contact region 5 contains Ni silicide, for example. The thickness of the second contact region 5 is approximately 5 nanometers (nm) or more and 200 nm or less, for example. A lower end of the second contact region 5 is positioned above the lower end of the third semiconductor region 3.

A sheet resistance in the third semiconductor region 3 below the second contact region 5 increases when the second contact region 5 is thickened while the third semiconductor region 3 is thinned, thereby making a device characteristic prone to deterioration. It is on the other hand more difficult to stably form a uniform film structure when the second contact region 5 is made thin due to degradation in thermal stability. Therefore, the thickness of the second contact region 5 is favorably 10 nm or more, preferably 20 nm or more.

A Ni silicide film is prone to aggregation in a heat treatment process of silicidation performed at 600° C. or higher, when the thickness of the second contact region 5 is less than 10 nm. As a result, it is more likely for a decrease in a yield as well as deterioration in device performance accompanying the increase in the sheet resistance to occur.

The second contact region 5 contains highly-concentrated carbon (C). It is favorable that a C composition on a topmost surface of the second contact region 5 is approximately 20 percent (%) or less. As a result, the adhesion between the second contact region 5 and the first electrode D1 is secured. The film exfoliation is suppressed as well in a subsequent process and when the device is in operation under high temperature. The satisfactory device characteristic can also be secured.

In order to adjust the C composition contained in the second contact region 5, for example, a layer of titanium (Ti) or the like that absorbs C is stacked when forming Ni silicide or the like contained in the second contact region 5. As another way to adjust the C composition, a layer of C deposited on a surface of the Ni silicide layer or the like contained in the second contact region 5 may be physically removed by a method such as argon (Ar) etching.

The trench T is formed in the first contact region 4 and the second contact region 5 in the Z direction. A lower end Tb of the trench T is positioned above the lower end 4b of the first contact region 4. The distance in the Z direction between the lower end Tb of the trench T (the lower end of the first portion 11) and the lower end 4b of the first contact region 4 is 50 nm or more, for example. There is a possibility that an Al spike or the like forming the first electrode D1 reaches the second semiconductor region 2 as the trench T gets deeper. The second semiconductor region 2 and the first semiconductor region 1 experience a short circuit when the Al spike reaches the second semiconductor region 2, thereby making it difficult to achieve a desired device operation.

The material forming the first electrode D1 is embedded in the trench T. The first portion 11 of the first electrode D1 is embedded in the trench T. The first portion 11 is in contact with the first contact region 4 on the lower side of the trench T.

The first portion 11 is in contact with the second contact region 5 on the upper side of the trench T. The second contact region 5 is not provided between the first portion 11 and the first contact region 4. The first electrode D1 establishes the satisfactory ohmic contact with the second semiconductor region 2 since the first portion 11 is in contact with the first contact region 4 in the trench T.

The first electrode D1 contains Al, for example. The second portion of the first electrode D1 is in contact with the second contact region 5 on the upper surface thereof. The first electrode D1 establishes the satisfactory ohmic contact with the third semiconductor region 3 since the second portion is in contact with the second contact region 5.

An intermediate layer may be provided between the first electrode D1 and the second contact region 5, the intermediate layer being formed of Ti or TiN. The intermediate layer allows for the enhanced adhesion between the first electrode D1 and the second contact region 5.

The intermediate layer may be provided between the first electrode D1 and the first contact region 4, in which case the intermediate layer is provided on an inner wall of the trench T. A stacked structure of Ti and Al or TiN and Al is provided in the trench T, for example. The intermediate layer allows for the enhanced adhesion between the first electrode D1 and the first contact region 4.

The insulating film 8 is provided on the first semiconductor region 1, the second semiconductor region 2, and the third semiconductor region 3. The insulating film 8 is formed of silicon oxide (SiO$_2$), for example. The thickness of the insulating film 8 is favorably 10 nm or more and 160 nm or less.

The control electrode 9 is provided on the insulating film 8. The control electrode 9 contains polycrystalline silicon to which an impurity is added with high concentration, for example. The impurity concentration is favorably $1\times10^{19}$ cm$^{-3}$, for example. The impurity is an impurity element having an n-type or a p-type. The impurity having the n-type or the p-type is added to the control electrode 9 in accordance with a threshold voltage of the semiconductor device 110. The thickness of the control electrode 9 is 10 nm or more and 50 nm or less, for example. The control electrode 9 is covered by a device isolation insulating region 7.

Another intermediate layer may be provided between the first electrode D1 and the device isolation insulating region 7, the intermediate layer being formed of TiN or TaC, for example. TiN and TaC have a metallic property that is thermally stable. The other intermediate layer suppresses the diffusion of the material (such as Al) forming the first electrode D1 from the first electrode D1 into the device isolation insulating region 7. The reliability of the device is improved particularly during high-temperature operation.

The material forming the other intermediate layer is a metal or an intermetallic compound having a metallic property that suppresses diffusion of Al or copper (Cu). A film thickness of the other intermediate layer is secured such that the other intermediate layer can sufficiently suppress the diffusion of the material forming the first electrode D1 while considering a heat treatment performed in a subsequent process in fabricating the device as well as temperature of the device during the actual operation thereof.

The other intermediate layer may be formed of a silicon nitride film (SiN) instead. SiN has higher resistance to hydrogen fluoride than $SiO_2$ does. SiN forming the other intermediate layer therefore suppresses a deviation in size of a contact hole in a treatment performed in a manufacturing process. For example, the deviation in size of the contact hole is suppressed in a treatment using dilute hydrofluoric acid or the like in the manufacturing process.

A treatment using dilute hydrofluoric acid is also performed when forming the first electrode D1 to remove an oxide film formed on a surface of Ni silicide or the like that is the second contact region 5. The deviation in size of the contact hole in this treatment is suppressed by using SiN as the material forming the other intermediate layer.

It is favorable, when using SiN as the material forming the other intermediate layer, that the thickness of the other intermediate layer is 5 nm or more, for example. The maximum thickness of the other intermediate layer is sufficiently smaller than an inner diameter of the contact hole. Considering the easiness of the manufacturing method, the thickness of the other intermediate layer is favorably 50 nm or less, for example.

Other than $SiO_2$, the material forming the insulating film 8 may be a high dielectric material such as $Si_3N_4$, $Al_2O_3$, $Ta_2O_5$, $TiO_2$, $La_2O_5$, $CeO_2$, $ZrO_2$, $HfO_2$, $SrTiO_3$, or $Pr_2O_3$. Silicate in which a metal ion is mixed in silicon oxide may be used as the material forming the insulating film 8 as well. Alternatively, LaAl oxide may be used as the material forming the insulating film 8. Furthermore, the insulating film 8 may have a stacked structure in which the aforementioned materials are combined.

When the insulating film 8 adopts the stacked structure, a fixed charge and an interface dipole may be formed in a film and an interface within the stacked structure. The fixed charge and the interface dipole are used to adjust a threshold. Moreover, nitrogen, hydrogen or the like may be introduced into the insulating film 8 or in the vicinity of the interface on each of the upper and lower sides of the insulating film 8. The fixed charge and interface trap density that can cause deterioration in the device characteristic are reduced as a result. Nitrogen, hydrogen or the like may be introduced into the insulating film 8 by introducing $NH_3$ gas, $N_2O$ gas and nitrogen plasma to a required location with appropriate concentration in accordance with the performance and the film thickness of the insulating film 8 required for the device.

A SiC substrate with a hexagonal single crystal structure that is used in general has a 4H—SiC structure with a four-layer stacking cycle. An energy band gap of SiC is 3.26 eV (three times that of Si), whereby it is difficult to establish an ohmic contact between SiC and the electrode metal. Moreover, a source electrode and a drain electrode in an n-channel MOSFET are required to establish an ohmic contact with an $n^+$-type semiconductor region and a $p^+$-type semiconductor region connected to a p-type well region adjacently to a source contact region. The satisfactory ohmic contact characteristic with the source region allows parasitic resistance of the MOSFET to decrease, thereby leading to the improvement in characteristic on-state resistance.

It is essential to decrease a Schottky barrier height (hereinafter simply referred to as an "SBH") formed at an interface between a metal and a semiconductor in order to decrease contact resistance caused by the ohmic contact. The SBH for an electron contradicts the SBH for a hole, whereby it is difficult to use a single metal material and achieve low contact resistivity at the same time.

Moreover, it is desired that a contact area in a power device such as a power transistor be reduced to an extent not affecting a device characteristic in terms of improving power density. The contact area cannot therefore be increased unreasonably in order to decrease the contact resistance caused by the ohmic contact.

In the semiconductor device 110 according to the embodiment, the first contact region 4 allows for the satisfactory ohmic contact between the first electrode D1 and the second semiconductor region 2, while the second contact region 5 allows for the satisfactory ohmic contact between the first electrode D1 and the third semiconductor region 3. Accordingly, the parasitic resistance of the semiconductor device 110 is decreased so that the characteristic on-state resistance is improved.

In addition, the satisfactory ohmic contact established with the p-type well region leads to the stabilization of a potential in the p-type well region. This also contributes to the realization of a device that is resistant to avalanche breakdown by allowing a surge current to flow effectively.

In the semiconductor device 110 according to the embodiment, the first contact region 4 is in three-dimensional contact with the second semiconductor region 2 in the X, Y, and Z directions. A hole generated in the second semiconductor region 2 when the device is in the OFF state can thus be discharged efficiently from the first contact region 4 to the first electrode D1. As a result, the semiconductor device 110 has the enhanced avalanche resistance compared to a semiconductor device not including the first contact region 4.

While the embodiment has described an example where Ni silicide is used as the material forming the second contact region 5, the second contact region may be formed of another material. A metal material which undergoes a solid phase reaction with SiC to form silicide may be used as the material forming the second contact region 5, the solid phase reaction involving a heat treatment.

The second contact region 5 may adopt a stacked structure and alloy formed of a metal material, such as a stacked structure of Ni and Ti or a Ni—Ti alloy, which preferentially reacts with C in the reaction with SiC.

Note that SiC reacts with metal at a temperature higher than a temperature at which Si reacts with metal. This possibly causes deterioration in the device characteristic. Now, the reaction temperature may be decreased by allowing the metal used as the material of the second contact region 5 to contain Si or germanium (Ge), for example. The composition of the metal used as the material of the second contact region 5 and Si or the like contained in the metal may be adjusted by controlling temperature, duration and the like of a heat treatment in accordance with a work function of the electrode required for the device. Besides Ni, the second contact region 5 can be formed of palladium (Pd), platinum (Pt), cobalt (Co), tantalum (Ta), hafnium (Hf), or zirconium (Zr).

A method of manufacturing the semiconductor device 110 according to the first embodiment will now be described.

Figure 2:
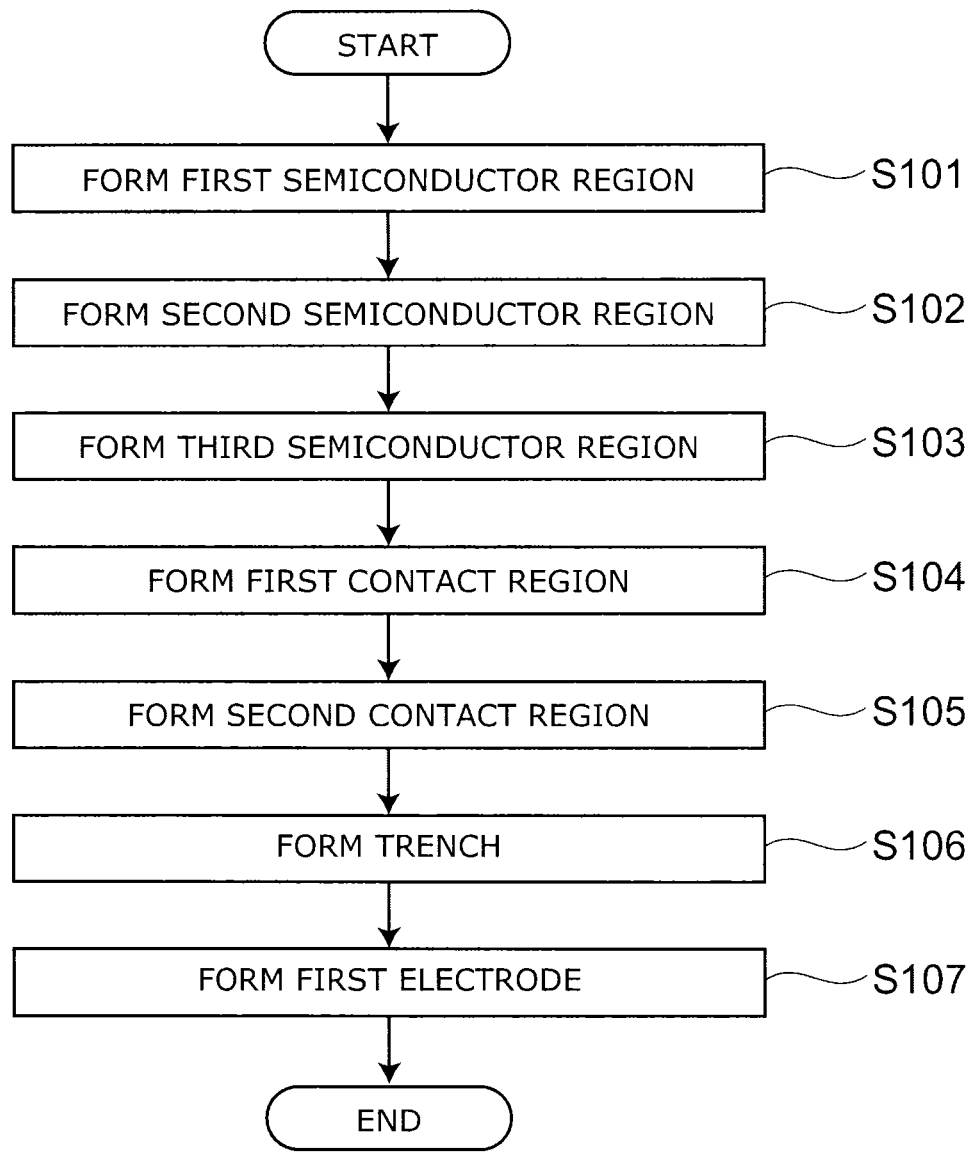
FIG. 2 is a flow chart illustrating a process performed in the method of manufacturing a semiconductor device according to the first embodiment.

FIG. 2 is a flow chart illustrating a process performed in the method of manufacturing a semiconductor device according to the first embodiment.

FIGS. 3 to 7 are schematic cross-sectional views each illustrating the method of manufacturing a semiconductor device according to the first embodiment.

As shown in FIG. 2, the method of manufacturing the semiconductor device according to the embodiment includes a process of forming the first semiconductor region (step S101), a process of forming the second semiconductor region (step S102), a process of forming the third semiconductor region (step S103), a process of forming the first contact region (step S104), a process of forming the second contact region (step S105), a process of forming the trench (step S106), and a process of forming the first electrode (step S107).

A treatment performed in each of the aforementioned processes will be described by following FIGS. 3 to 7.

Figure 3:
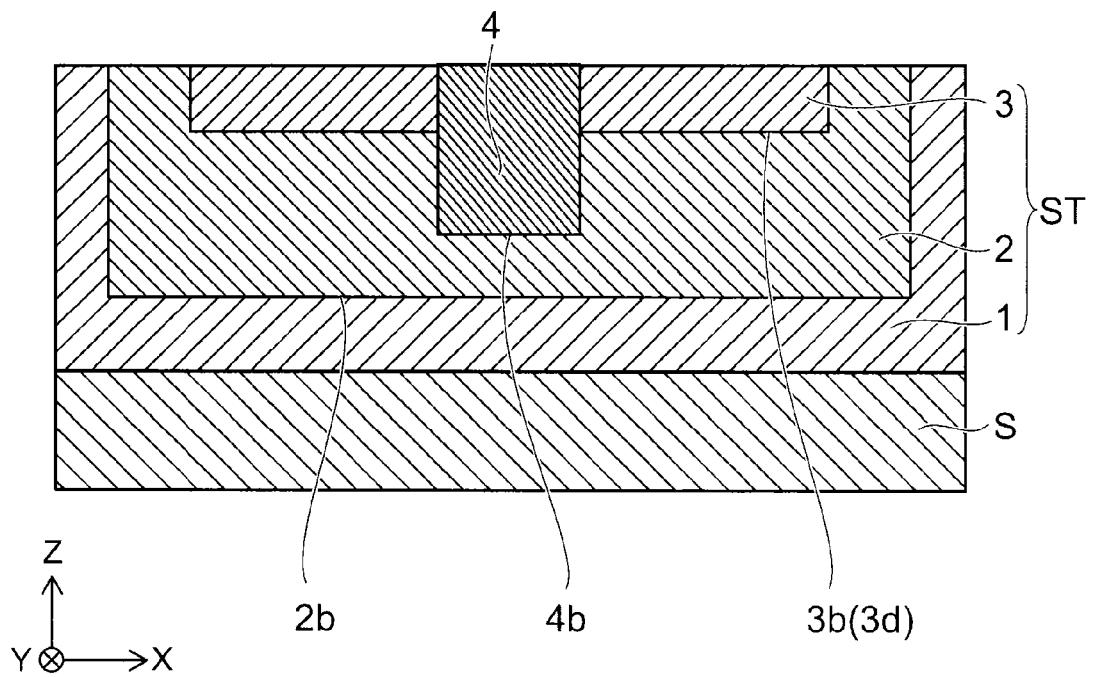
FIG. 3 to FIG. 7 are schematic cross-sectional views each illustrating the method of manufacturing a semiconductor device according to the first embodiment.

First, the substrate S is prepared as shown in FIG. 3. The substrate S is an $n^+$-type 4H—SiC substrate, for example. The first semiconductor region 1 is thereafter formed on an upper surface of the substrate S. The first semiconductor region 1 contains $n^-$-type 4H—SiC, for example. The thickness of the first semiconductor region is approximately 10 μm. The first semiconductor region 1 is formed by a method such as epitaxial growth.

Then, the second semiconductor region 2, the third semiconductor region 3, and the first contact region 4 are respectively formed by subjecting the first semiconductor region 1 to ion implantation and activation anneal of an impurity.

The conductivity type of the second semiconductor region 2 is a p-type, for example. The second semiconductor region 2 is formed by ion-implanting a p-type impurity (at least either B or Al, for example) into a predetermined range of the first semiconductor region 1, followed by the activation anneal of the impurity.

The conductivity type of the third semiconductor region 3 is an $n^+$-type, for example. The third semiconductor region 3 is formed by ion-implanting an n-type impurity (at least either N or P, for example) into a predetermined range of the second semiconductor region 2, followed by the activation anneal of the impurity.

The conductivity type of the first contact region 4 is a $p^+$-type, for example. The first contact region 4 is formed by ion-implanting a p-type impurity (at least either B or Al, for example) into a predetermined range on an upper surface of the structure ST. The ion of the p-type impurity is implanted partway through the second semiconductor region 2 from the upper surface of the structure ST. The ion implantation is followed by the activation anneal of the impurity.

Here, a mask pattern used for the ion implantation may be formed by the combination of photolithography and isotropic or anisotropic etching in order to define each of the second semiconductor region 2, the third semiconductor region 3, and the first contact region 4. It is effective that the temperature of the substrate S is set high while the ion implantation is performed in order to suppress reduced crystallinity of SiC that is caused by physical damage done at the time of the ion implantation. In this case, it is favorable that the temperature of the substrate S is approximately 400° C. or higher and 650° C. or lower.

Figure 4:
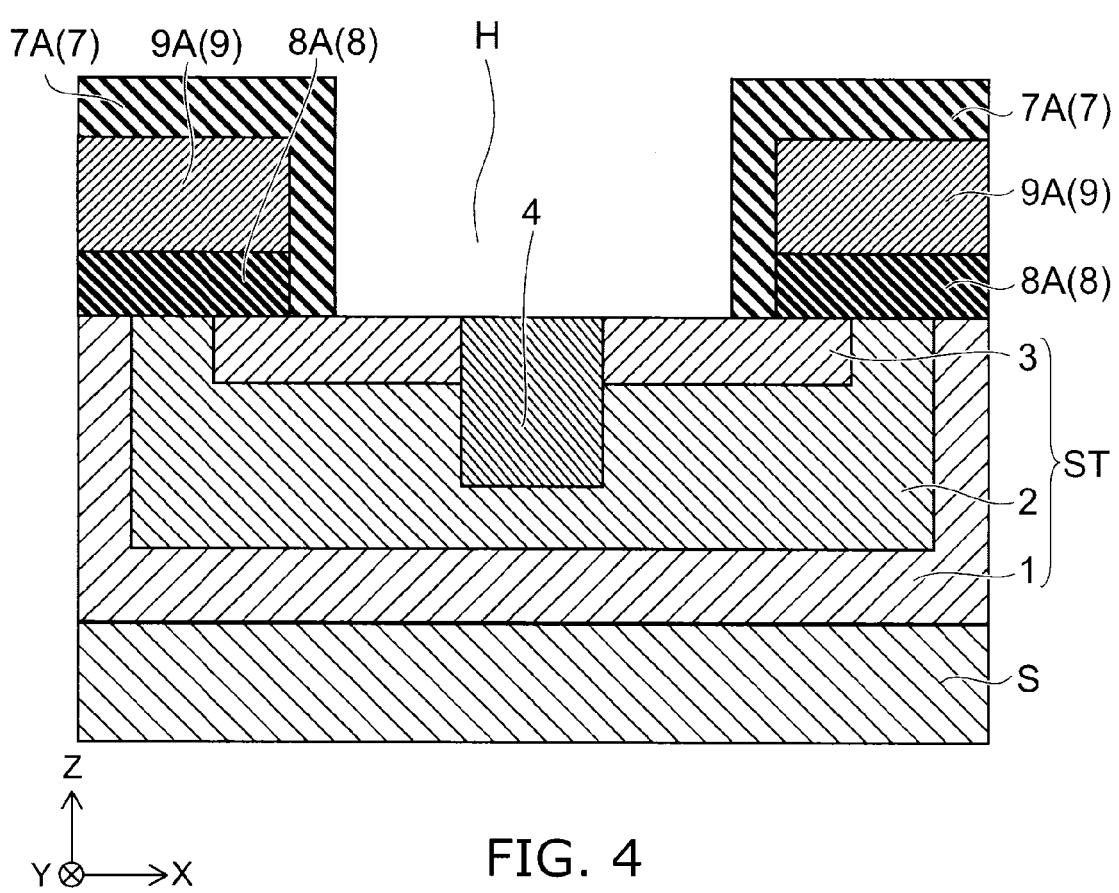

Subsequently, as shown in FIG. 4, an insulating film material 8A and a control electrode material 9A are formed so that a gate stack structure including the insulating film material 8A and the control electrode 9 is formed by the combination of photolithography and anisotropic or isotropic etching. The insulating film material 8A is formed of $SiO_2$, for example. The control electrode material 9A is formed of $n^+$-type polycrystalline silicon, for example.

An insulating material 7A is thereafter formed on the control electrode 9. The insulating material 7A is formed of $SiO_2$, for example, and is formed by a method such as CVD (Chemical Vapor Deposition). Next, a contact hole H is formed by removing a part of the insulating material 7A and a part of the insulating film material 8A.

The contact hole H is formed on the third semiconductor region 3. The contact hole H is formed by performing photolithography and anisotropic etching on the insulating material 7A and the insulating film material 8A, for example. An upper surface 4a of the first contact region 4 is exposed at a center of the contact hole H. The insulating film material 8A turns into the insulating film 8, once the contact hole H has been formed.

Figure 5:
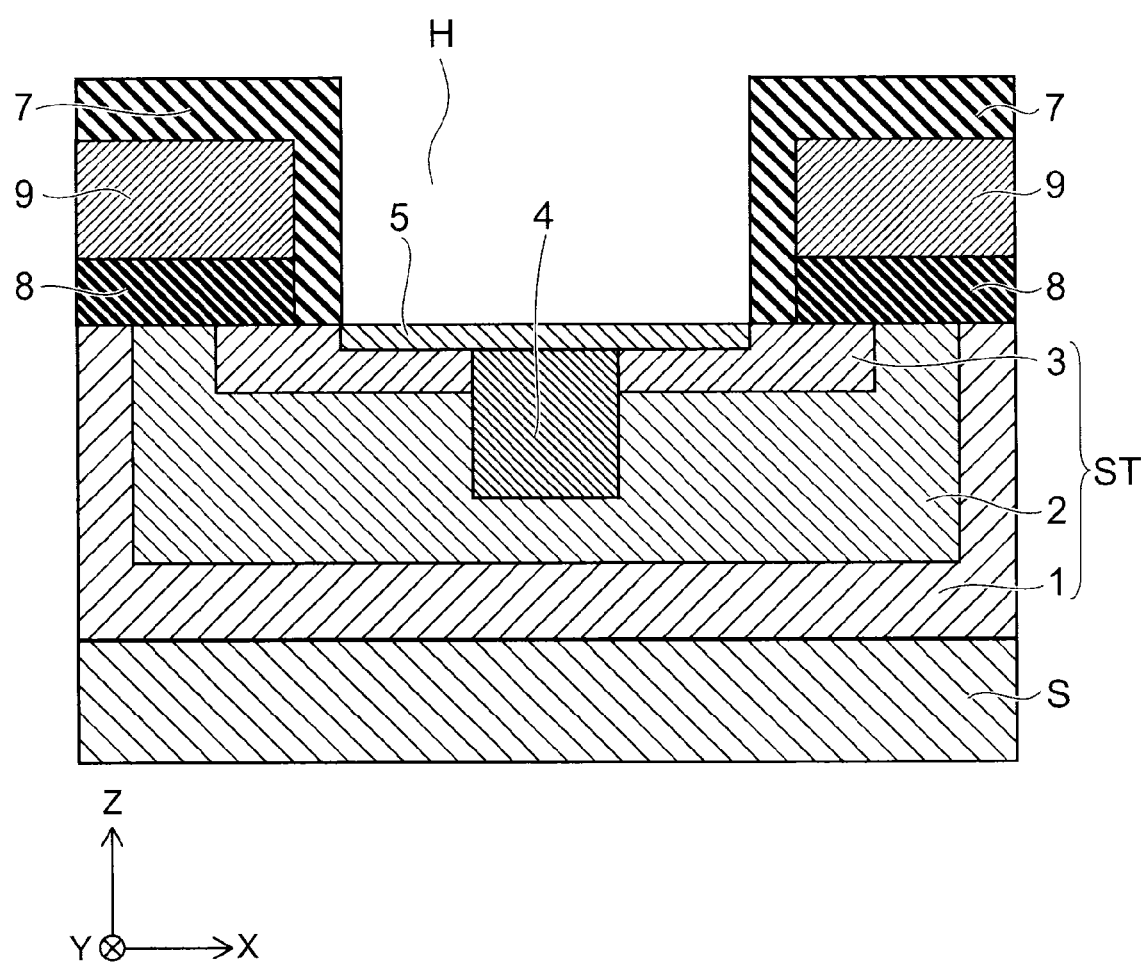

The second contact region 5 is then formed as shown in FIG. 5. The second contact region 5 is formed by a self-alignment technique via the contact hole H. For example, a Ni film is formed via the contact hole H when the second contact region 5 is formed of Ni silicide, the Ni film being formed by a sputtering method, for example.

Next, Ni silicide (the second contact region 5) is formed at an interface portion between the Ni film and SiC that is the third semiconductor region 3 by the heat treatment. The Ni film that is unreacted on the device isolation insulating region 7 is removed by an acid solution treatment.

Figure 6:
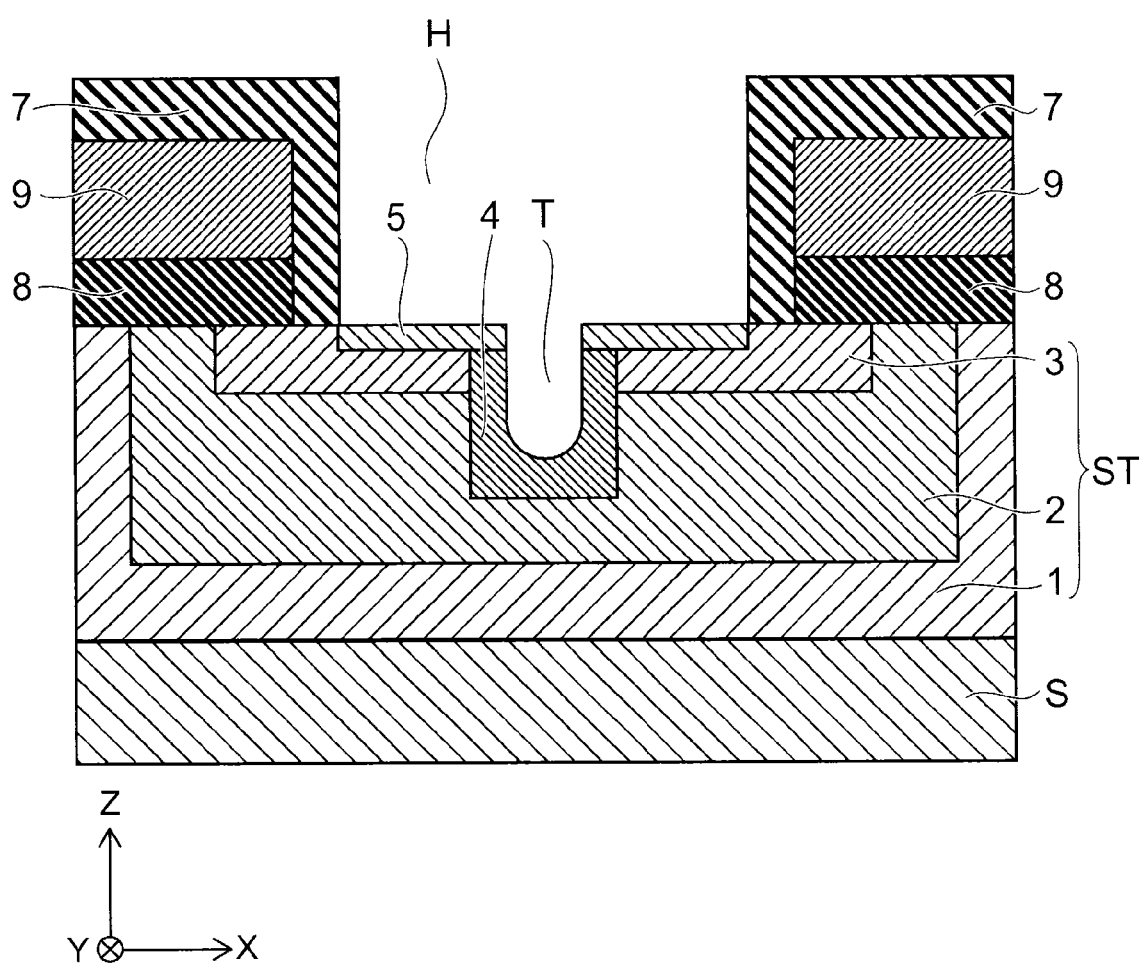

Then, a resist with an opening is formed on an inner side of the first contact region 4 in a photo-resist process, and a part of the second contact region 5 and a part of the first contact region 4 are removed by etching through the opening. The trench T is formed as a result of the etching, as shown in FIG. 6.

When performing etching, an optimal method or condition of the etching is selected for each of the second contact region 5 and the first contact region 4 thereunder.

For example, the isotropic etching is performed by using an acid solution that can dissolve Ni silicide when the second contact region 5 is formed of Ni silicide. On the other hand, the anisotropic etching (such as RIE: Reactive Ion Etching) is performed by using $CF_4$ and $O_2$ gases when the first contact region 4 is formed of SiC, for example. Alternatively, the second contact region 5 formed of Ni silicide may be physically etched by irradiating the region with Ar ion, for example.

Here, a metal layer may be used as a mask material when sufficient resist resistance is not secured in etching SiC. A metal having high etching selection ratio for the SiC etching includes Ni, Ni silicide, Cr, ITO (Indium Tin Oxide), and Al. An optimal metal from among these metals is selected as appropriate.

Besides $CF_4$ and $O_2$, a gas from among $SF_6$, $CHF_3$, $NF_3$, Cl, IBr, $PF_3$, $NF_3$, and $BF_3$, for example, that is optimal for use in removing SiC by the RIE method may be selected as appropriate. Alternatively, the physical Ar etching may be performed on SiC. Note that the RIE is preferred over the Ar etching considering the flatness of a bottom part of the trench T. An increase in the flatness suppresses the formation of an Al spike.

Figure 7:
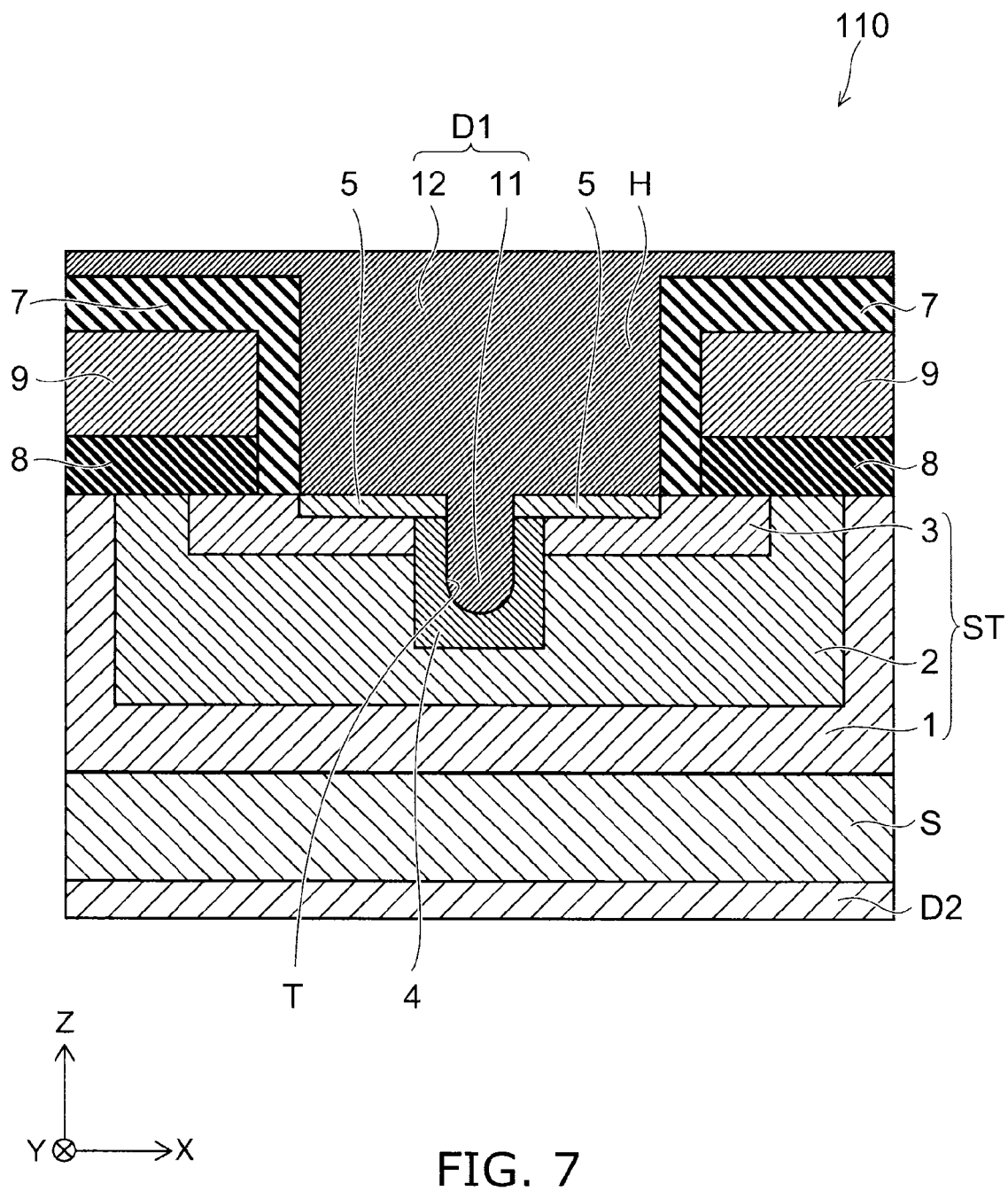

Next, as shown in FIG. 7, the second electrode D2 is formed on a lower surface of the substrate S. In the embodiment, a stacked film in which Ni and Ti are stacked in this order from a side of the substrate S is adopted as the second electrode D2. The Ni film has a thickness that is thick enough to suppress the deposition of C on a silicide surface. The thickness of the Ni film is favorably 100 nm or more, for example. Moreover, a metal species similar to silicide formed on the surface of the substrate S is selected.

The Ti film has a thickness that is thick enough to sufficiently suppress the deposition of C on a surface of the Ti film.

It is required that silicide be formed on the lower surface of the substrate S under a condition such that an interface characteristic has an ohmic resistance. A heat treatment performed at 800° C. or higher is typically favored. However, a condition for the heat treatment is not limited to the above condition, and the heat treatment may be performed under a condition that is optimal in accordance with the characteristic of each electrode material when using a metal species with an ohmic characteristic at low temperature or a technique realizing an ohmic electrode at low temperature such as an impurity segregation technique.

Considering a processing temperature or the like, the second electrode D2 may be formed before the second contact region 5 is formed when Ni silicide is used as the second contact region 5.

Subsequently, the first electrode D1 is formed in an upper part of the device. The first electrode D1 is formed of a material such as Al. The material of the first electrode D1 is first formed in the trench T, in the contact hole H, and on the device isolation insulating region 7. An unnecessary portion of the material of the first electrode D1 is then removed by a photolithography process and an etching process, thereby forming the first electrode D1. A portion of the first electrode D1 in the trench T corresponds to the first portion 11, while a portion of the first electrode D1 in the contact hole H corresponds to the second portion 12.

This completes the manufacture of the semiconductor device 110.

(Second Embodiment)

A semiconductor device according to a second embodiment will now be described.

Figure 8:
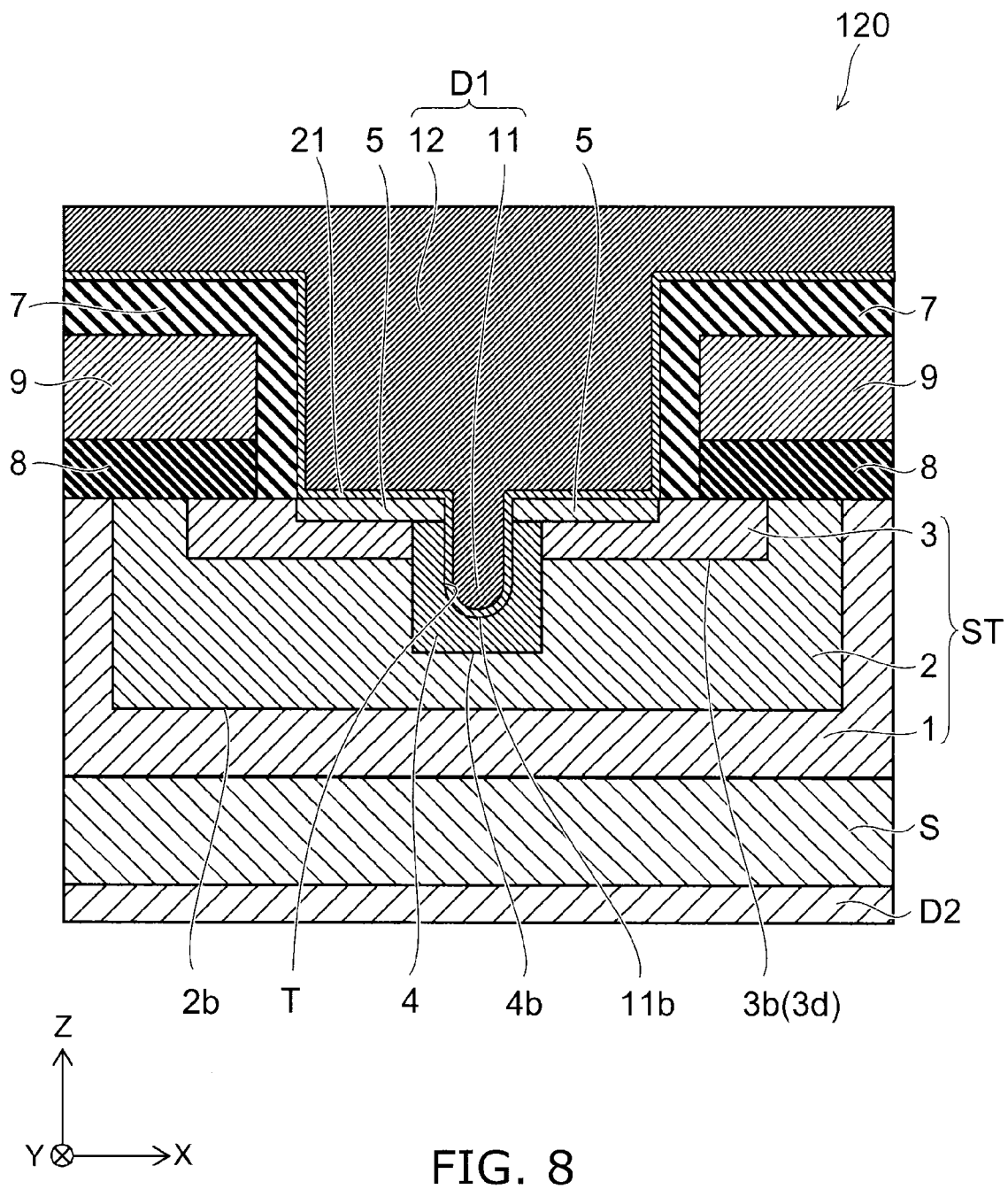
FIG. 8 is a schematic view illustrating a configuration of a semiconductor device according to the second embodiment.

FIG. 8 is a schematic view illustrating a configuration of a semiconductor device according to the second embodiment.

As shown in FIG. 8, a semiconductor device 120 according to the embodiment includes a first intermediate layer 21 in addition to the configuration of the semiconductor device 110 according to the first embodiment.

The first intermediate layer 21 is provided at least between the first electrode D1 and the first contact region 4. The first intermediate layer 21 may also be provided between the first electrode D1 and the second contact region 5, and between the first electrode D1 and the device isolation insulating region 7. The first intermediate layer 21 contains platinum (Pt), for example.

In order to manufacture the semiconductor device 120, a material forming the first intermediate layer 21 is formed after the process of forming the trench T shown in FIG. 6 and before the process of forming the first electrode D1 shown in FIG. 7.

The thickness of the first intermediate layer 21 is favorably 3 nm or more and 50 nm or less, for example. It is more difficult to obtain a continuous film structure with the film thickness of 3 nm or less. The first intermediate layer 21 may possibly be discontinued particularly at a side wall portion of the trench T formed in the first contact region 4. A region where interface resistance between the first electrode D1 and SiC is not sufficiently reduced is formed in the discontinued portion. It is thus difficult to have a stable potential in a p-type well structure.

A work function of Pt is the greatest among metal elements. Therefore, a Schottky barrier for a hole is decreased at an interface formed between the first contact region 4 and the first intermediate layer 21. The contact resistance between a first portion 11 and the first contact region 4 is decreased as a result.

Moreover, the first intermediate layer 21 provided between a second portion 12 and the second contact region 5 allows the contact resistance between the second portion 12 and the second contact region 5 to be decreased.

Furthermore, the first intermediate layer 21 provided between the first electrode D1 and the device isolation insulating region 7 suppresses the intrusion of a material forming the first electrode D1 into the device isolation insulating region 7. When Al is used as the material forming the first electrode D1, for example, an Al spike possibly intrudes from the first electrode D1 into the device isolation insulating region 7. The Al spike affects the electrical insulation between the first electrode D1 and a control electrode 9.

The first intermediate layer 21 functions as a barrier against the Al spike, thereby improving the reliability of the semiconductor device 120.

The first intermediate layer 21 included in the semiconductor device 120 allows a second semiconductor region 2 to realize a satisfactory ohmic contact characteristic while maintaining a low on-state resistance. As a result, the potential in the second semiconductor region 2 (the p-type well region) is stabilized. The semiconductor device 120 has increased resistance to avalanche breakdown as well by allowing a surge current to flow effectively. Furthermore, a module can be scaled in size and have higher performance by using a parasitic PiN as a parallel PiN diode of an inverter.

The thickness of the first intermediate layer 21 is preferably 3 nm or more and 20 nm or less. The contact resistance between the first portion 11 and the first contact region 4 is further reduced by controlling the thickness within such range. This is because Al in the first electrode D1 diffuses into an interface between the electrode and the semiconductor region formed of SiC through a grain boundary of Pt, so that a dopant concentration in the first contact region 4 in the vicinity of a contact interface formed with Pt is increased. As a result, the contact resistance is further decreased while achieving a high work function, a contact electrode and a high SiC acceptor concentration in the first intermediate layer 21 all at the same time.

While the embodiment has described an example where Pt is used as the material of the first intermediate layer 21, a metal other than Pt may be used instead. The first intermediate layer 21 may be formed of a metal material or a metal alloy material with a work function greater than the work function of the material forming the second contact region 5. For example, the first intermediate layer 21 may be formed of a metal or metal alloy material of Re, tungsten (W), molybdenum (Mo), ruthenium (Ru), or iridium (Ir), or formed of a nitride or a carbide of any of these metals.

(Third Embodiment)

A semiconductor device according to a third embodiment will now be described.

Figure 9:
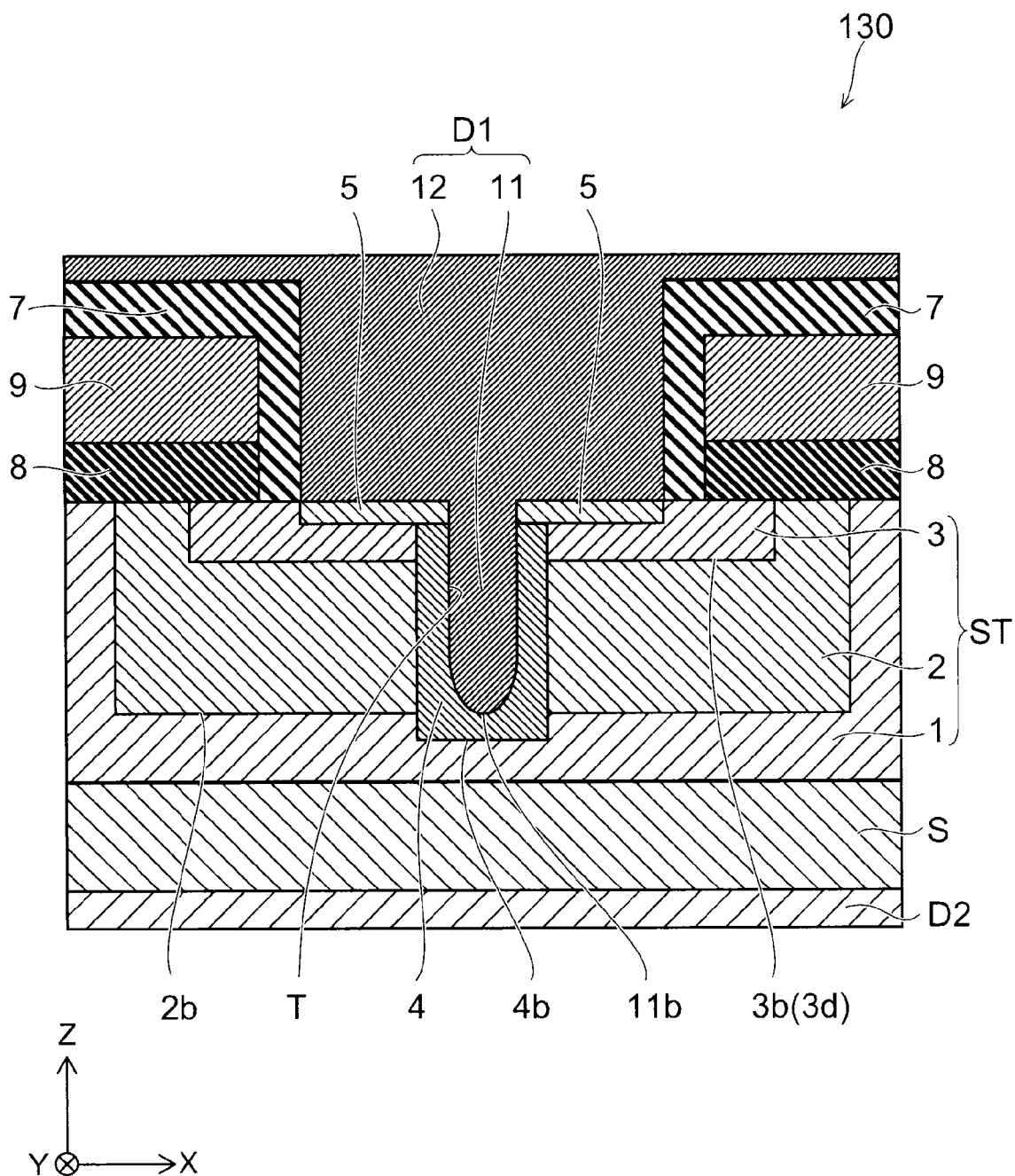
FIG. 9 is a schematic view illustrating a configuration of a semiconductor device according to the third embodiment.

FIG. 9 is a schematic view illustrating a configuration of a semiconductor device according to the third embodiment.

As shown in FIG. 9, a semiconductor device 130 according to the embodiment differs from the semiconductor device 110 according to the first embodiment in terms of the first contact region 4 and the first portion 11.

A lower end 4b of the first contact region 4 in the semiconductor device 130 is positioned below a lower end 2b of a second semiconductor region 2. The first contact region 4 is provided partway through a first semiconductor region 1 from an upper surface of a structure ST.

The trench T is provided in the first contact region 4. The first portion 11 is embedded into the trench T. A contact area between the first contact region 4 and the second semiconductor region 2 in a Z direction is increased in the semiconductor device 130 as compared to the semiconductor device 110. As a result, a hole is discharged more effectively in the off operation in the semiconductor device 130 than in the semiconductor device 110, thereby achieving enhanced avalanche resistance.

(Fourth Embodiment)

A semiconductor device according to a fourth embodiment will now be described.

Figure 10:
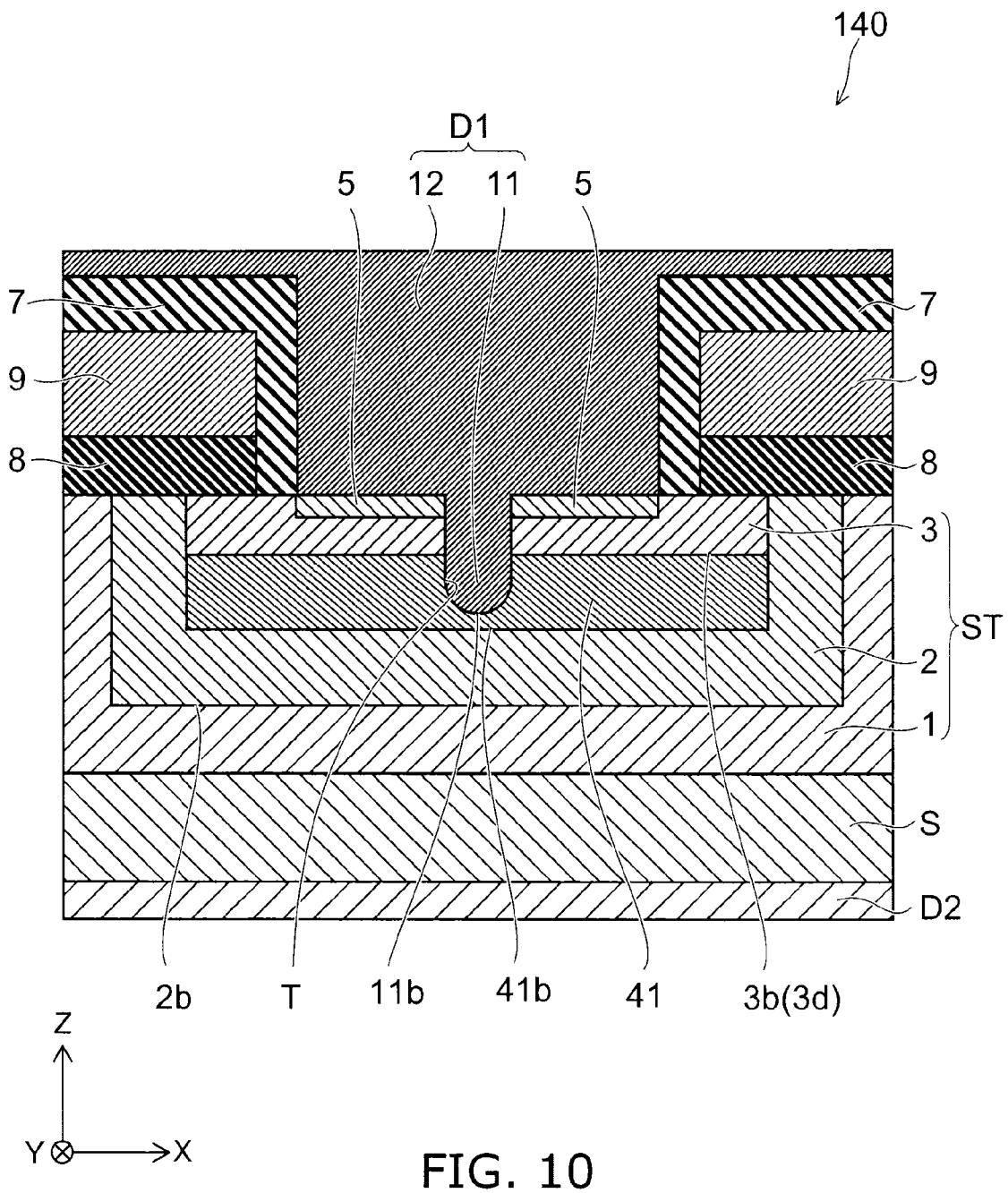
FIG. 10 is a schematic view illustrating a configuration of a semiconductor device according to the fourth embodiment.

FIG. 10 is a schematic view illustrating a configuration of a semiconductor device according to the fourth embodiment.

As shown in FIG. 10, a semiconductor device 140 according to the embodiment includes a first contact region 41 different from the first contact region 4 included in the semiconductor device 110 as shown in FIG. 1.

The first contact region 41 is provided between the first portion 11 and the second semiconductor region 2 and between the third semiconductor region 3 and the second semiconductor region 2. The first contact region 41 is provided on a lower side of the third semiconductor region 3. The first contact region 41 is provided between the second semiconductor region 2 and the third semiconductor region 3 in a Z direction.

The first contact region 41 is in contact with a lower surface 3d of the third semiconductor region 3 and with the third semiconductor region 3 in an X-Y plane. An area of the first contact region 41 in the Z direction is substantially equal to an area of the third semiconductor region 3 in the Z direction.

A trench T is provided partway through the first contact region 41 from an upper surface of a structure ST. The first portion of the first electrode D1 is embedded in the trench T.

A contact area between a lower end 41b of the first contact region 41 and the second semiconductor region 2 is increased in the semiconductor device 140 as compared to the semiconductor device 110. Accordingly, an area of ohmic contact between the first contact region 41 and the second semiconductor region 2 is increased, thereby further improving the characteristic on-state resistance. The semiconductor device 140 has the enhanced avalanche resistance as a result.

Now, a method of manufacturing the semiconductor device 140 according to the fourth embodiment will be described.

Figure 11:
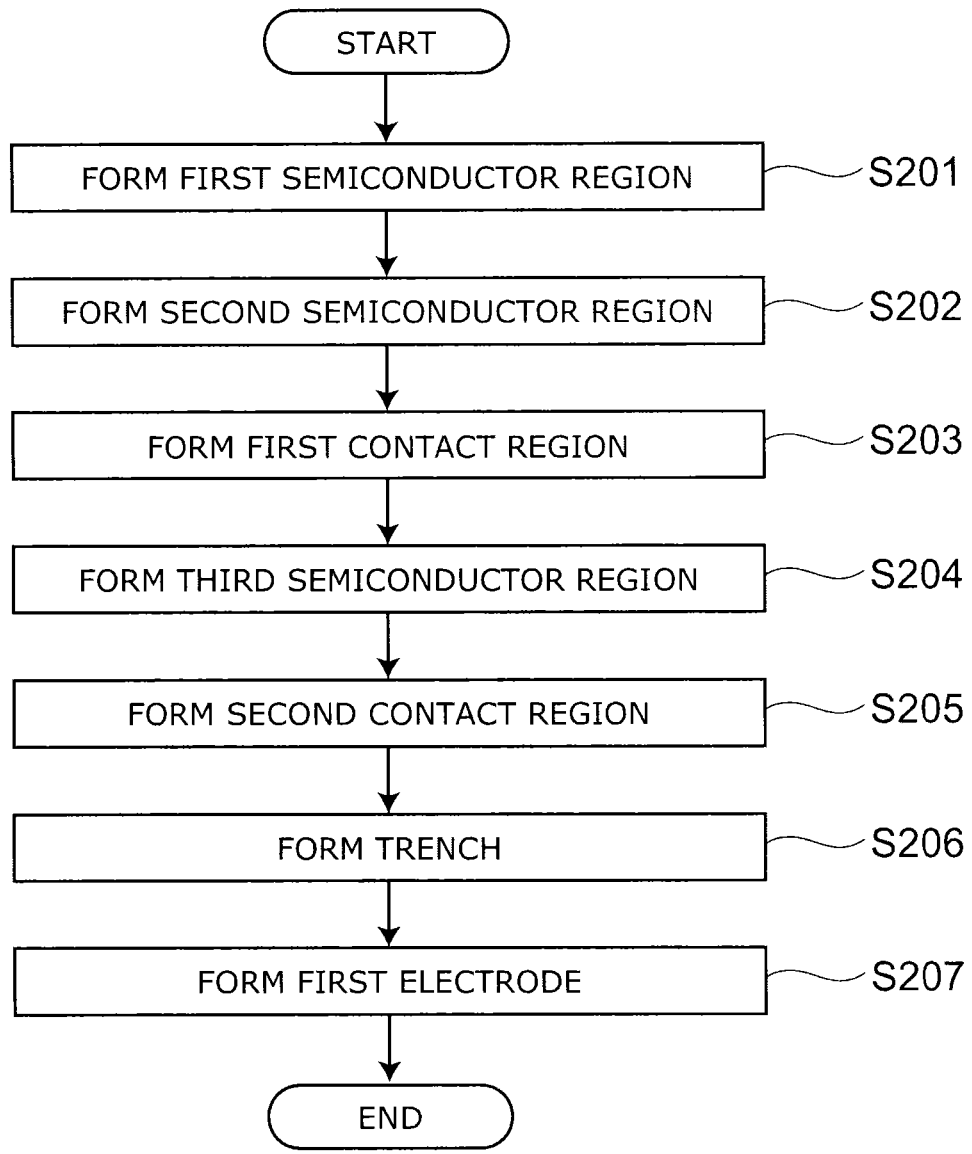
FIG. 11 is a flow chart illustrating a process performed in the method of manufacturing a semiconductor device according to the first embodiment.

FIG. 11 is a flow chart illustrating a process performed in the method of manufacturing a semiconductor device according to the fourth embodiment.

FIGS. 12 to 16 are schematic cross-sectional views each illustrating the method of manufacturing a semiconductor device according to the fourth embodiment.

As shown in FIG. 11, the method of manufacturing a semiconductor device according to the embodiment includes a process of forming a first semiconductor region (step S201), a process of forming the second semiconductor region (step S202), a process of forming the first contact region (step S203), a process of forming the third semiconductor region (step S204), a process of forming a second contact region (step S205), a process of forming the trench (step S206), and a process of forming the first electrode (step S207).

A treatment performed in each of the aforementioned processes will be described by following FIGS. 12 to 16.

Figure 12:
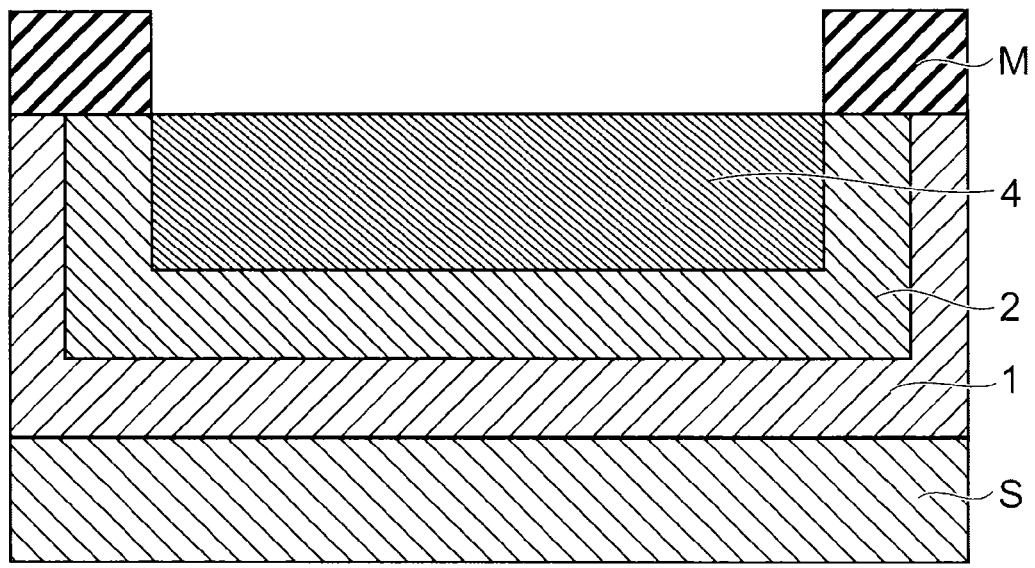
FIG. 12 to FIG. 16 are schematic cross-sectional views each illustrating the method of manufacturing a semiconductor device according to the fourth embodiment.

First, a substrate S is prepared as shown in FIG. 12. The substrate S is an $n^+$-type 4H—SiC substrate, for example. The first semiconductor region 1 is thereafter formed on an upper surface of the substrate S. The first semiconductor region 1 contains $n^-$-type 4H—SiC, for example. The thickness of the first semiconductor region is approximately 10 µm. The first semiconductor region 1 is formed by a method such as epitaxial growth.

Then, the second semiconductor region 2 and the first contact region 4 are respectively formed by subjecting the first semiconductor region 1 to ion implantation and activation anneal of an impurity.

The conductivity type of the second semiconductor region 2 is a p-type, for example. The second semiconductor region 2 is formed by ion-implanting a p-type impurity (at least either B or Al, for example) into a predetermined range of the first semiconductor region 1, followed by the activation anneal of the impurity.

The conductivity type of the first contact region 4 is a $p^+$-type, for example. The first contact region 4 is formed by ion-implanting a p-type impurity (at least either B or Al, for example) into a predetermined range on an upper surface of the second semiconductor region 2. The ion of the p-type impurity is implanted partway through the second semiconductor region 2 from the upper surface of the second semiconductor region 2. The ion implantation is followed by the activation anneal of the impurity.

Here, a mask pattern used for the ion implantation may be formed by the combination of photolithography and isotropic or anisotropic etching in order to define each of the second semiconductor region 2 and the first contact region 4. A mask pattern M used in forming the first contact region 4 is shown in FIG. 12.

Figure 13:
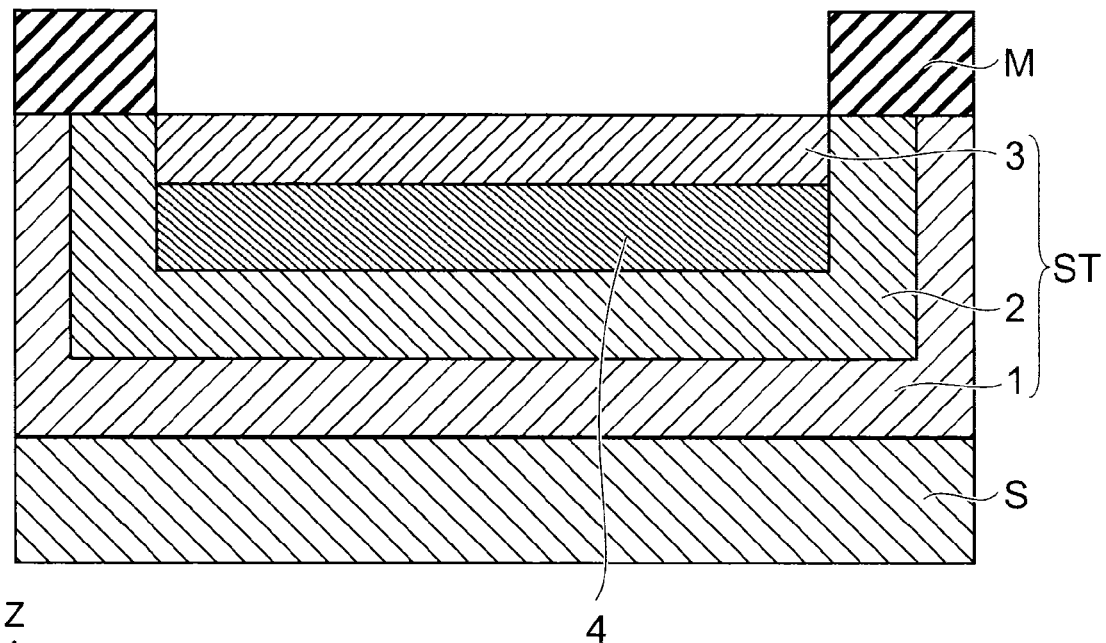

The third semiconductor region 3 is then formed on the first contact region 4 as shown in FIG. 13. The conductivity type of the third semiconductor region 3 is an $n^+$-type, for example. The third semiconductor region 3 is formed by ion-implanting an n-type impurity (at least either N or P, for example) into a predetermined range of the first contact region 4, followed by the activation anneal of the impurity.

The area of the third semiconductor region 3 in the Z direction is substantially the same as the area of the first contact region 4 in the Z direction. Accordingly, a mask pattern used in forming the third semiconductor region 3 is the same as the mask pattern M used in forming the first contact region 4.

Figure 14:
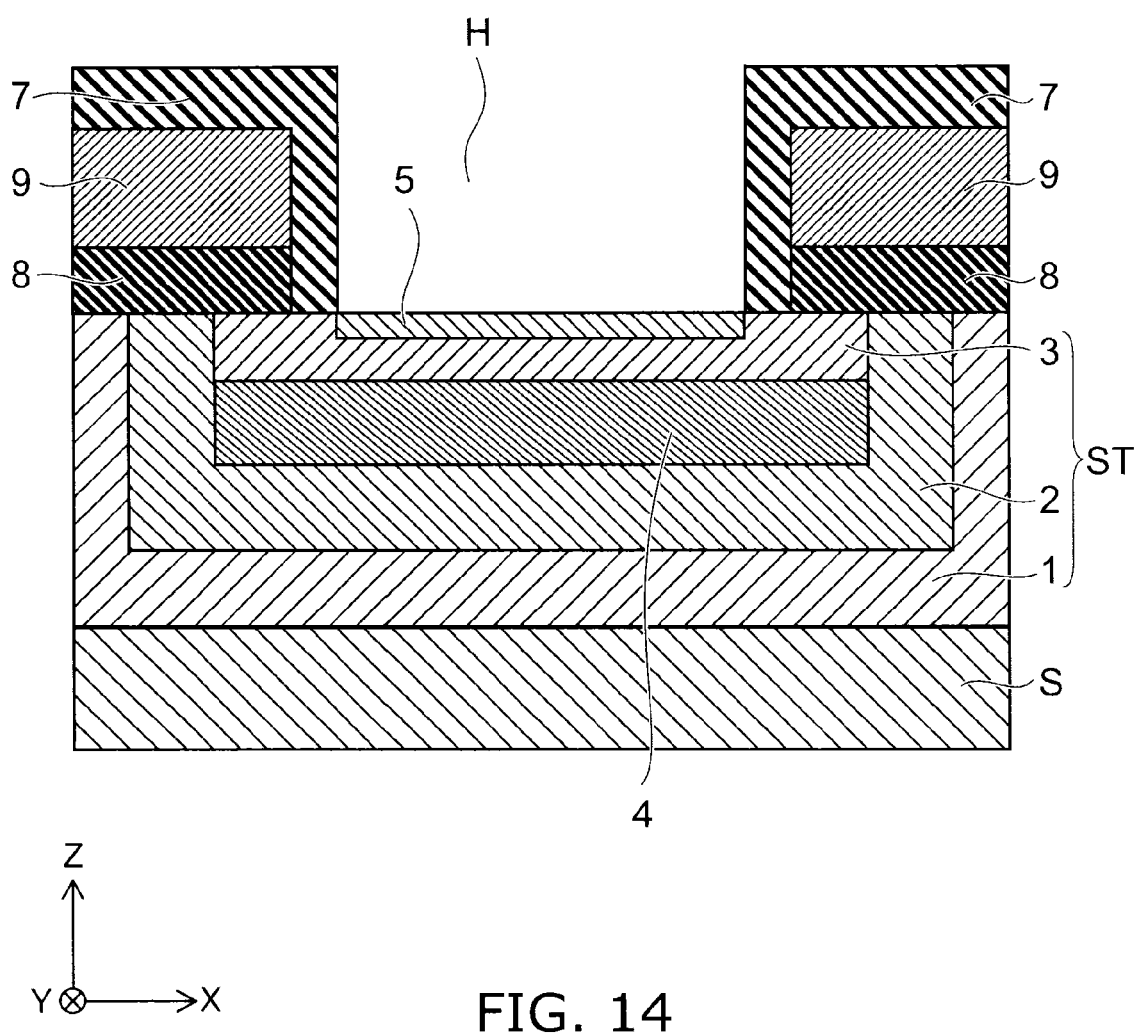

Subsequently, as shown in FIG. 14, the insulating film 8, the control electrode 9, the device isolation insulating region 7, and the contact hole H are formed on the structure ST. The second contact region 5 is further formed on the structure ST via the contact hole H. A method of forming these is similar to what has been described in the method of manufacturing the semiconductor device 110 as shown in FIGS. 4 and 5.

Figure 15:
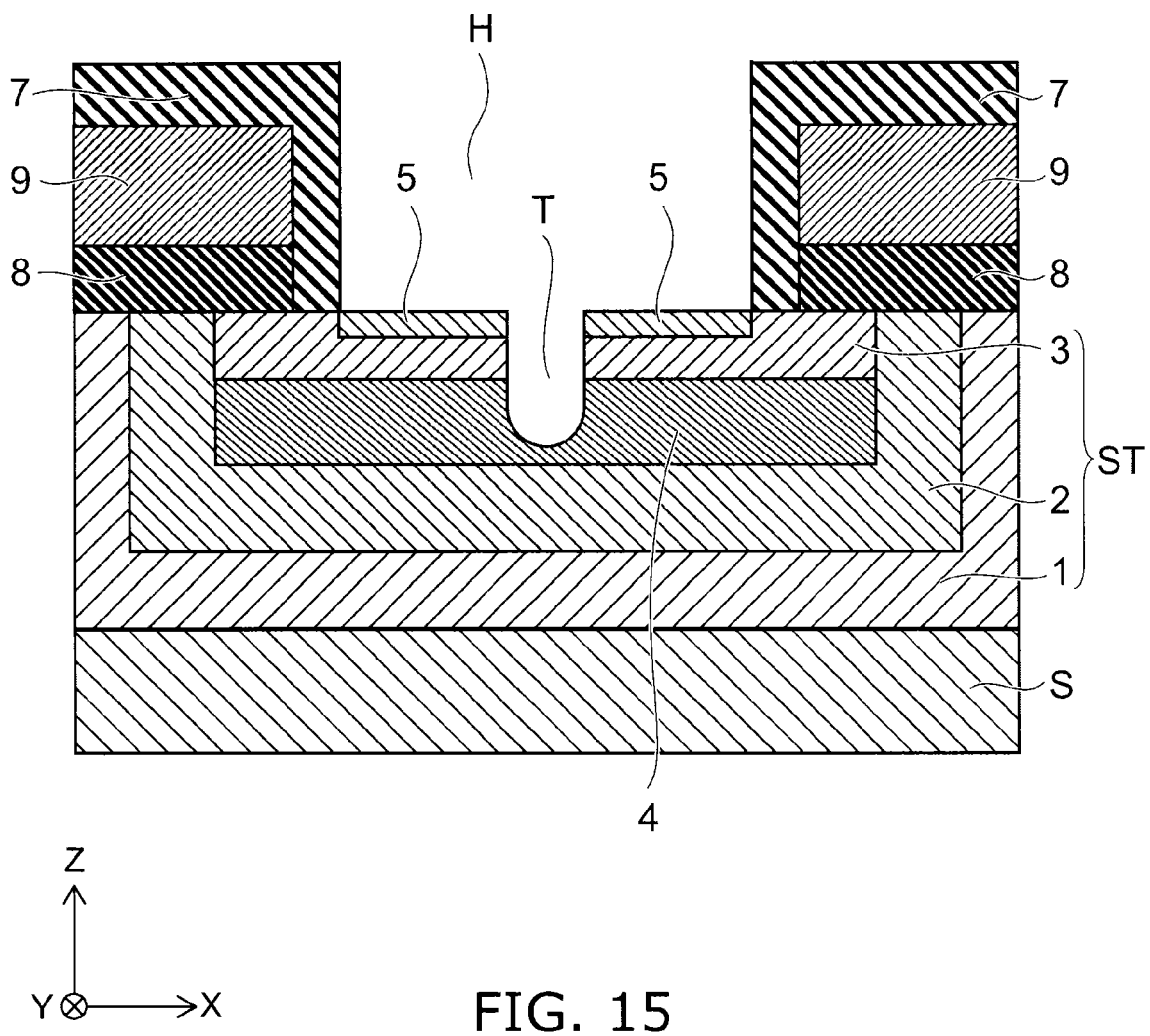

Next, the trench T is formed as shown in FIG. 15. A method of forming the trench T is similar to what has been described in the method of manufacturing the semiconductor device 110 as shown in FIG. 6. The trench T is formed partway through the first contact region 4 while passing through the second contact region 5 in the Z direction.

Figure 16:
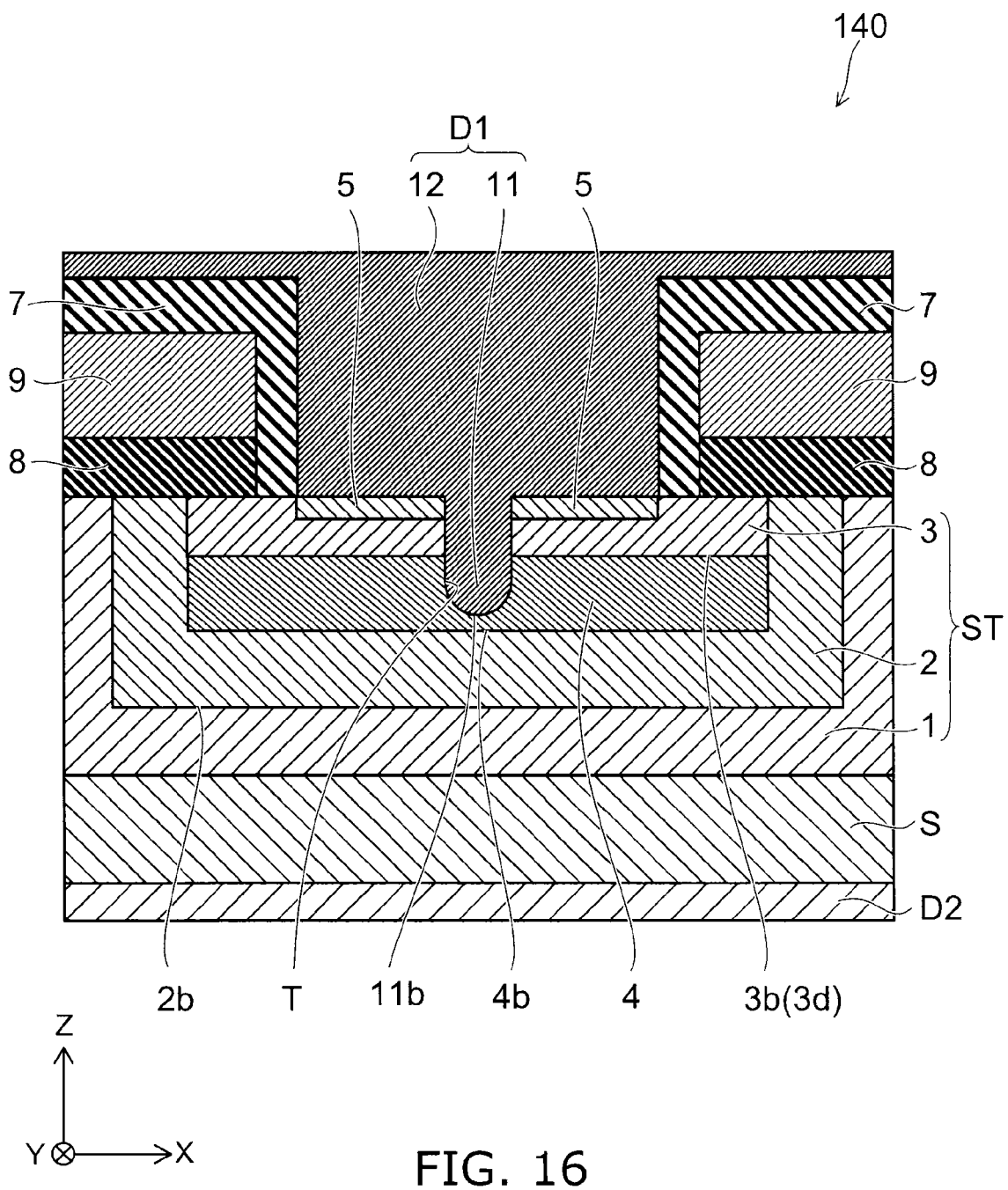

Next, the first electrode D1 and the second electrode D2 are formed as shown in FIG. 16. A method of forming the first electrode D1 and the second electrode D2 is similar to what has been described in the method of manufacturing the semiconductor device 110 as shown in FIG. 7.

This completes the manufacture of the semiconductor device 140.

The first contact region 4 and the third semiconductor region 3 are formed by using the same mask pattern M in the method of manufacturing the semiconductor device 140. The manufacturing process is simplified as a result compared to a case where these regions are formed by using a separate mask pattern.

(Fifth Embodiment)

A semiconductor device according to a fifth embodiment will now be described.

Figure 17:
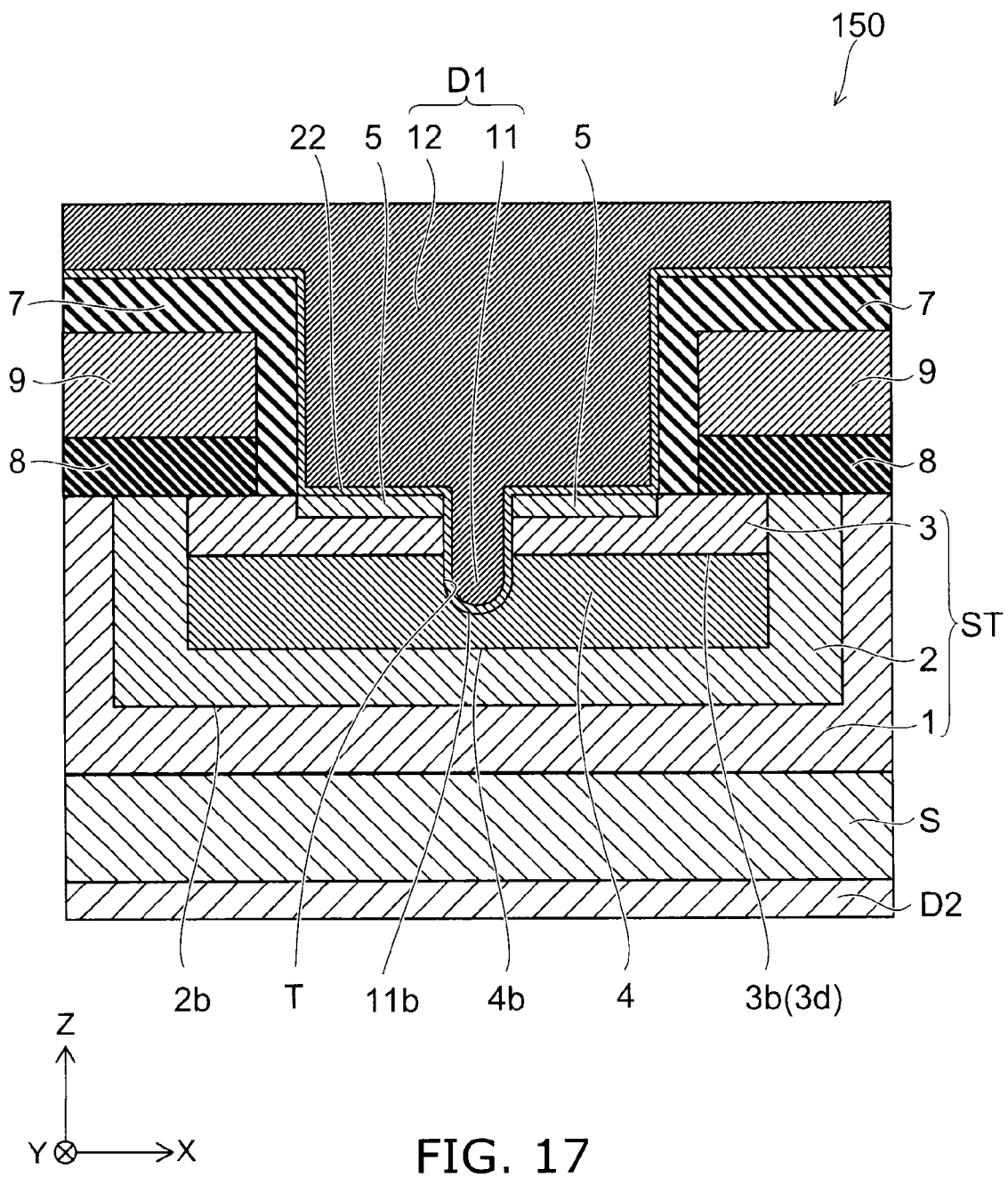
FIG. 17 is a schematic view illustrating a configuration of a semiconductor device according to the fifth embodiment.

FIG. 17 is a schematic view illustrating a configuration of a semiconductor device according to the fifth embodiment.

As shown in FIG. 17, a semiconductor device 150 according to the embodiment includes a second intermediate layer 22 in addition to the configuration of the semiconductor device 140 according to the fourth embodiment.

The second intermediate layer 22 is provided at least between the first electrode D1 and the first contact region 4. The second intermediate layer 22 may also be provided between the first electrode D1 and a third semiconductor region 3, between the first electrode D1 and the second contact region 5, and/or between the first electrode D1 and the device isolation insulating region 7. The second intermediate layer 22 contains platinum (Pt), for example.

The second intermediate layer 22 provided between a first portion 11 and the first contact region 4 allows the contact resistance between the first portion 11 and the first contact region 4 to be decreased. Moreover, the second intermediate layer 22 provided between the second portion 12 and the second contact region 5 allows the contact resistance between the second portion 12 and the second contact region 5 to be decreased. Furthermore, the second intermediate layer 22 provided between the first electrode D1 and the device isolation insulating region 7 suppresses the intrusion of a material forming the first electrode D1 into the device isolation insulating region 7. The reliability of the semiconductor device 150 is improved as a result.

The second intermediate layer 22 may be formed of a metal material or a metal alloy material with a work function greater than the work function of the material forming the second contact region 5. For example, the second intermediate layer 22 may be formed of a metal or metal alloy material of Re, W, Mo, Ru, or Ir, or formed of a nitride or a carbide of any of these metals.

(Sixth Embodiment)

A semiconductor device according to a sixth embodiment will now be described.

Figure 18:
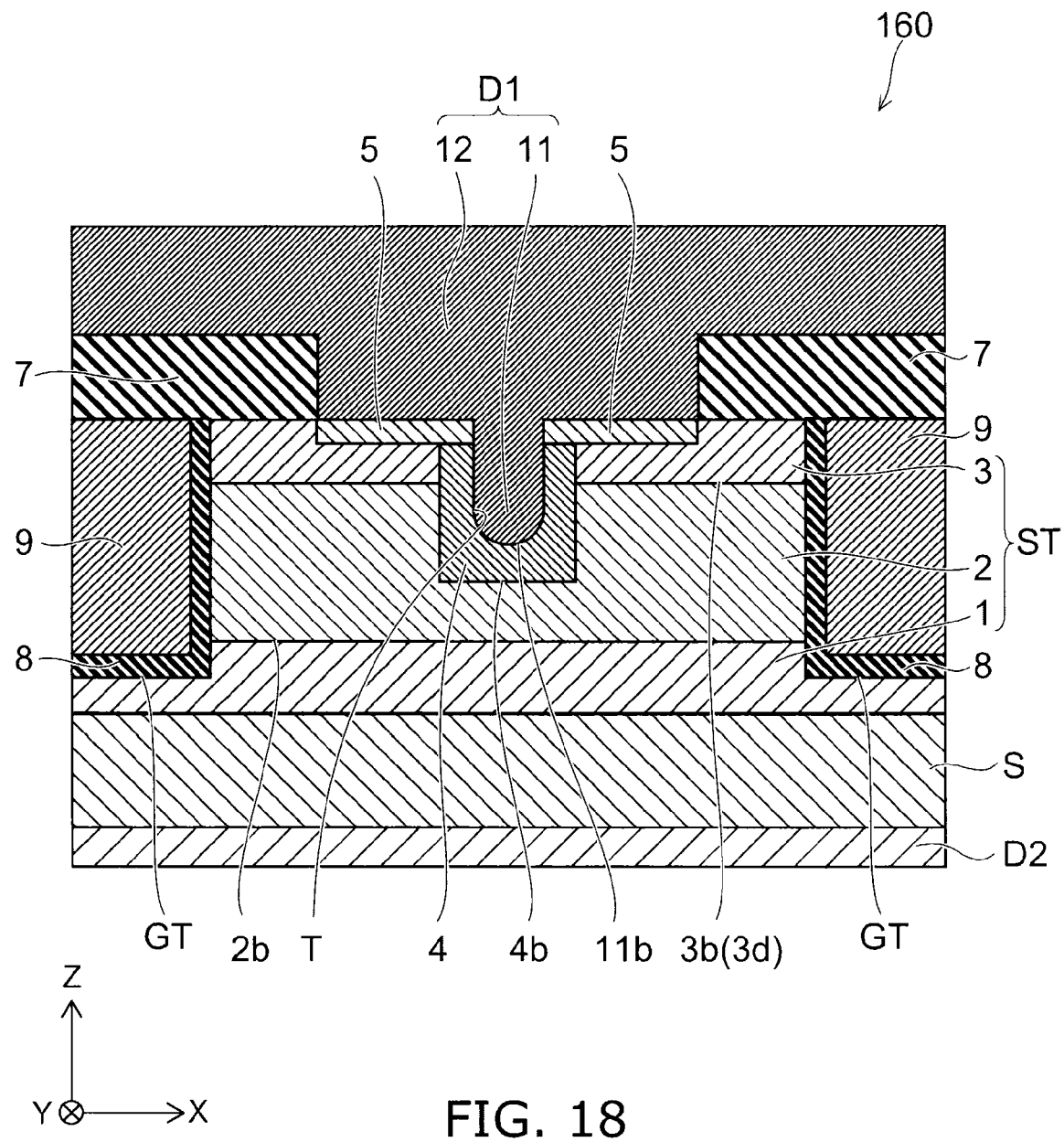
FIG. 18 is a schematic view illustrating a configuration of a semiconductor device according to the sixth embodiment.

FIG. 18 is a schematic view illustrating a configuration of a semiconductor device according to the sixth embodiment.

As shown in FIG. 18, a semiconductor device 160 according to the embodiment has a trench gate structure. A control electrode 9 of the semiconductor device 160 extends downward from an upper surface of a structure ST. The insulating film 8 is provided between the control electrode 9 and the second semiconductor region 2. The control electrode 9 and the insulating film 8 are provided within a gate trench GT that is provided in the structure ST.

The gate trench GT is provided partway through the first semiconductor region 1 from the upper surface of the structure ST. The insulating film 8 is provided along the inner wall of the gate trench GT. A channel is formed in the second semiconductor region 2 facing the control electrode 9 through the insulating film 8 when the semiconductor device 160 is in operation.

The satisfactory ohmic contact between the first electrode D1 and the second semiconductor region 2 and between the first electrode D1 and the third semiconductor region 3 can be obtained in the semiconductor device 160 with the trench gate structure by including the first contact region 4 and the second contact region 5.

As described above, the low on-state resistance and the high avalanche breakdown voltage can be achieved by the semiconductor device and the method of manufacturing the same according to the embodiments.

The embodiments and variations thereof that have been described above are not to limit the scope of the invention. The example which has used SiC as the semiconductor may use Si instead, for example. The semiconductor may also be replaced by a compound semiconductor such as a gallium nitride semiconductor or by a wide band gap semiconductor such as a diamond semiconductor.

While each of the aforementioned embodiments and variations has illustrated the MOSFET as an example, the invention is applicable to various devices other than the MOSFET. An IGBT (Insulated Gate Bipolar Transistor), for example, may be used as a device other than the MOSFET.

Furthermore, additions, omissions, and design changes of a component as well as a combination of characteristics included in each of the embodiments made as appropriate with respect to each of the aforementioned embodiments and variations by those skilled in the art are to be included in the scope of the invention without departing from the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a first semiconductor region of a first conductivity type;
   a second semiconductor region of a second conductivity type, the second semiconductor region being provided on the first semiconductor region;
   a third semiconductor region of a first conductivity type, the third semiconductor region being provided on the second semiconductor region;
   a first electrode having a first portion and a second portion, the first portion having a lower end being positioned below a lower end of the third semiconductor region, the second portion being in contact with the first portion, the second portion being provided on the third semiconductor region;
   a first contact region provided between the first portion and the second semiconductor region, the first contact region being electrically connected to the first electrode and the second semiconductor region;
   a second contact region provided between the second portion and the third semiconductor region, the second contact region being electrically connected to the first electrode and the third semiconductor region; and
   an intermediate layer provided between the first electrode and the first contact region, the intermediate layer having a work function greater than a work function of the first electrode.

2. The device according to claim 1, wherein a lower end of the first contact region is positioned below the lower end of the third semiconductor region.

3. The device according to claim 1, wherein a lower end of the first contact region is positioned above a lower end of the second semiconductor region.

4. The device according to claim 1, wherein a lower end of the first contact region is positioned below a lower end of the second semiconductor region.

5. The device according to claim 1, wherein each of the first semiconductor region, the second semiconductor region, and the third semiconductor region contains silicon carbide.

6. The device according to claim 1, wherein an impurity concentration of the first contact region is higher than an impurity concentration of the second semiconductor region.

7. The device according to claim 1, wherein the second contact region contains silicide.

8. The device according to claim 1, wherein the first contact region is provided between the second semiconductor region and the third semiconductor region in a first direction from the first semiconductor region toward the second semiconductor region.

9. The device according to claim 8, wherein the first contact region is in contact with a lower surface of the third semiconductor region.

10. The device according to claim 1,
wherein a thickness of the second contact region is 5 nanometers or more and 200 nanometers or less.

11. A method of manufacturing a semiconductor device, the method comprising:
forming a first semiconductor region of a first conductivity type on a substrate;
forming a second semiconductor region of a second conductivity type on the first semiconductor region;
forming a third semiconductor region of a first conductivity type on the second semiconductor region;
forming a first contact region after performing the forming the third semiconductor region, a position of a lower end of the first contact region in a first direction from the first semiconductor region toward the second semiconductor region being located between a position of a lower end of the third semiconductor region in the first direction and a position of a lower end of the second semiconductor region in the first direction;
forming a second contact region on the third semiconductor region after performing the forming the first contact region;
forming a trench from an upper surface of the second contact region, a position of a lower end of the trench in the first direction being located below a position of an upper end of the first contact region in the first direction and above a position of a lower end of the first contact region in the first direction; and
providing a conductive material in the trench and on the second contact region to form a first electrode, the first electrode having:
a first portion made from the conductive material, the first portion being provided in the trench and electrically connected to the first contact region; and
a second portion made from the conductive material, the second portion being in contact with the first portion and electrically connected to the second contact region.

12. A method of manufacturing a semiconductor device, the method comprising:
forming a first semiconductor region of a first conductivity type on a substrate;
forming a second semiconductor region of a second conductivity type on the first semiconductor region;
forming a mask on the second semiconductor region, the mask having an opening and forming a first contact region on the second semiconductor region through the opening;
forming a third semiconductor region of a first conductivity type on the first contact region through the opening;
forming a second contact region on the third semiconductor region;
forming a trench from an upper surface of the second contact region, a position of a lower end of the trench in a first direction from the first semiconductor region toward the second semiconductor region being located below a position of an upper end of the first contact region in the first direction and above a position of a lower end of the first contact region in the first direction; and
providing a conductive material in the trench and on the second contact region to form a first electrode, the first electrode having:
a first portion made from the conductive material, the first portion being provided in the trench and electrically connected to the first contact region; and
a second portion made from the conductive material, the second portion being in contact with the first portion and electrically connected to the second contact region.

13. The method according to claim 11, wherein the forming the first contact region includes forming the lower end of the first contact region above a lower end of the second semiconductor region.

14. The method according to claim 11, wherein the forming the trench includes forming the lower end of the trench below the lower end of the third semiconductor region.

15. The method according to claim 11, wherein each of the first semiconductor region, the second semiconductor region, and the third semiconductor region contains silicon carbide.

16. The method according to claim 11, wherein the forming the first contact region includes allowing the first contact region to have an impurity concentration higher than an impurity concentration of the second semiconductor region.

17. The method according to claim 11, wherein the second contact region contains silicide.

18. A semiconductor device comprising:
a first semiconductor region of a first conductivity type;
a second semiconductor region of a second conductivity type, the second semiconductor region being provided on the first semiconductor region;
a third semiconductor region of a first conductivity type, the third semiconductor region being provided on the second semiconductor region;
a first electrode having a first portion and a second portion, the first portion having a lower end being positioned below a lower end of the third semiconductor region, the second portion being in contact with the first portion, the second portion being provided on the third semiconductor region;
a first contact region provided between the first portion and the second semiconductor region, the first contact region being electrically connected to the first electrode and the second semiconductor region; and
a second contact region provided between the second portion and the third semiconductor region, the second contact region being electrically connected to the first electrode and the third semiconductor region, the second contact region containing silicide,
an upper surface of the second contact region is located in a plane including an upper surface of the third semiconductor layer.

* * * * *